(12) United States Patent
Miyamoto et al.

(10) Patent No.: US 12,742,808 B2
(45) Date of Patent: Sep. 22, 2026

(54) PLUG-TYPE ELECTRIC DISCHARGE DETECTION UNIT AND ELECTRIC DISCHARGE DETECTION SYSTEM

(71) Applicant: NITTO KOGYO CORPORATION, Nagakute (JP)

(72) Inventors: Atsushi Miyamoto, Nagakute (JP); Hiroyuki Ito, Nagakute (JP); Tomonori Kakehi, Nagakute (JP); Yusuke Aita, Nagakute (JP); Koichiro Kato, Nagakute (JP)

(73) Assignee: NITTO KOGYO CORPORATION, Nagakute (JP)

( * ) Notice: Subject to any disclaimer, the term of this patent is extended or adjusted under 35 U.S.C. 154(b) by 245 days.

(21) Appl. No.: 18/689,614

(22) PCT Filed: Sep. 7, 2022

(86) PCT No.: PCT/JP2022/033518
§ 371 (c)(1),
(2) Date: Mar. 6, 2024

(87) PCT Pub. No.: WO2023/038051
PCT Pub. Date: Mar. 16, 2023

(65) Prior Publication Data

US 2024/0345151 A1 Oct. 17, 2024

(30) Foreign Application Priority Data

Sep. 10, 2021 (JP) ................................ 2021-147744
Mar. 30, 2022 (JP) ................................ 2022-055029

(51) Int. Cl.
*H02H 3/16* (2006.01)
*G01R 31/00* (2006.01)
*H02H 1/00* (2006.01)

(52) U.S. Cl.
CPC ......... *G01R 31/002* (2013.01); *H02H 1/0023* (2013.01); *H02H 3/162* (2013.01)

(58) Field of Classification Search
CPC ..... G01R 31/002; H02H 1/0023; H02H 3/162
See application file for complete search history.

(56) References Cited

U.S. PATENT DOCUMENTS 5,946,180 A * 8/1999 Simpson ............ H01R 13/7039 361/93.3
6,192,065 B1 2/2001 Ferreira et al.
(Continued)

FOREIGN PATENT DOCUMENTS

CN 1177530 A 4/1998
EP 3084906 B1 9/2020
(Continued)

*Primary Examiner* — Scott Bauer
(74) *Attorney, Agent, or Firm* — The Webb Law Firm

(57) ABSTRACT

A plug-in discharge detection unit includes two plugs of a cathode and an anode configured to allow insertion into respective two plug insertion holes of a plug socket. A discharge detection section configured to allow detection of a noise of discharge superimposed on a voltage or current, and an arithmetic section configured to allow determination of whether discharge has occurred based on the noise. The detection unit further includes a ground terminal electrically connected to a ground; at least one first switch electrically connected to a secondary side of the respective plug; and a current limiting resistor electrically connected to a secondary side of the first switch. The current limiting resistor has a secondary side electrically connected to the ground terminal, and the arithmetic section changes, if determining that discharge has occurred, the first switch from an open state to a closed state to pass an artificial leakage current with a current value in accordance with a resistance value of the current limiting resistor through the ground terminal.

5 Claims, 25 Drawing Sheets

(56) References Cited

U.S. PATENT DOCUMENTS

| | | | | |
|---|---|---|---|---|
| 6,477,021 | B1 | 11/2002 | Haun et al. | |
| 2002/0039026 | A1 * | 4/2002 | Stroth ................ | G01R 31/3277 324/509 |
| 2015/0168487 | A1 | 6/2015 | Parker et al. | |
| 2017/0012425 | A1 | 1/2017 | Pons Gonzalez et al. | |
| 2019/0219630 | A1 | 7/2019 | Parker et al. | |
| 2019/0293701 | A1 | 9/2019 | Marshall et al. | |
| 2019/0296539 | A1 | 9/2019 | Kanemaru et al. | |
| 2021/0035750 | A1 | 2/2021 | Miyamoto et al. | |

FOREIGN PATENT DOCUMENTS

| | | | |
|---|---|---|---|
| JP | 2001045652 | A | 2/2001 |
| JP | 2009257930 | A | 11/2009 |
| JP | 2019184480 | A | 10/2019 |
| JP | 202025460 | A | 2/2020 |
| JP | 2020134231 | A | 8/2020 |
| JP | 202115046 | A | 2/2021 |
| JP | 202115047 | A | 2/2021 |
| JP | 202181399 | A | 5/2021 |
| JP | 2021518624 | A | 8/2021 |

* cited by examiner 12
13
16
16
19
20
21
22
23
30
31
32
14
41
51
52
1

Fig. 26
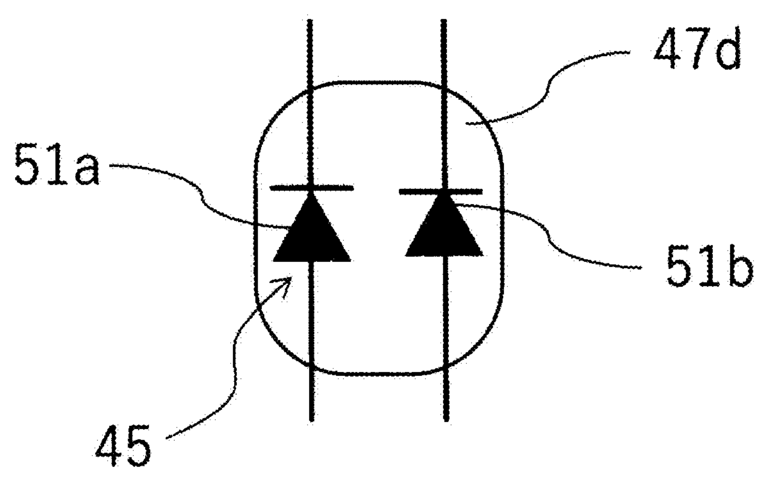
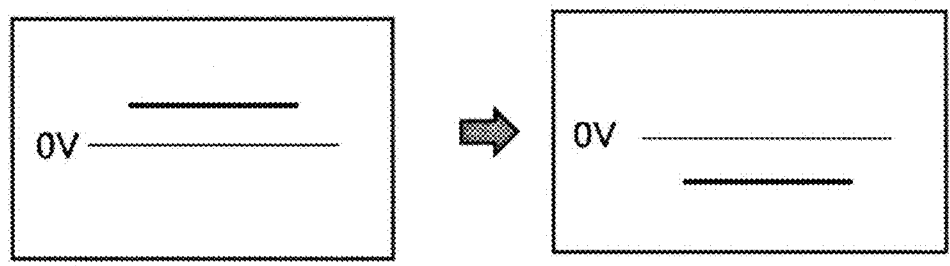
Fig. 27A
Fig. 27B
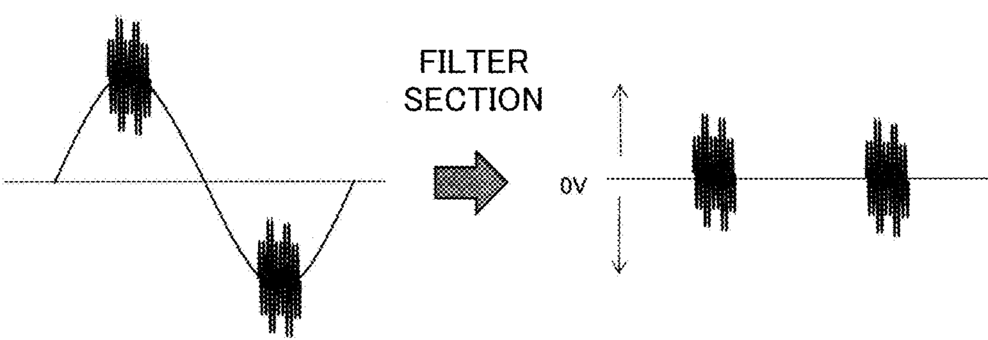
Fig. 28A
Fig. 28B

Fig. 29

| STATE | COLOR OF LIGHT EMISSION |
|---|---|
| NORMAL | GREEN |
| OCCURRENCE OF DISCHARGE | RED |
| ABNORMALITY IN +5 V | COLORLESS |
| ABNORMALITY IN −5 V | ORANGE |

PLUG-TYPE ELECTRIC DISCHARGE DETECTION UNIT AND ELECTRIC DISCHARGE DETECTION SYSTEM

CROSS-REFERENCE TO RELATED APPLICATIONS

This application is the United States national phase of International Patent Application No. PCT/JP2022/033518 filed Sep. 7, 2022, and claims priority to Japanese Patent Application Nos. 2021-147744 filed Sep. 10, 2021 and 2022-055029 filed Mar. 30, 2022, the disclosures of which are hereby incorporated by reference in their entireties.

BACKGROUND OF THE INVENTION

Field of the Invention

The present invention relates to a plug-in discharge detection unit and a discharge detection system including the plug-in discharge detection unit.

Description of Related Art

Japanese Patent Application Kokai Publication No. 2019-184480 (Patent Document 1) discloses a discharge detection structure to detect discharge occurred in electrical circuits. This discharge detection structure is built in, for example, a distribution board to be electrically connected to an electrical circuit, such as indoor wirings. The electrical circuit is electrically connected to a load, not shown. The load refers to a device that operates by consuming power, such as a lighting fixture, a display, an air conditioner, and a refrigerator, for example. The discharge detection structure is provided with a high pass filter section and a determination section. The high pass filter section is electrically connected to the secondary side of make-and-break switches (branch breakers) configuring the distribution board. If an accident, such as tracking, a short circuit, disconnection, and a leakage current, occurs in the electrical circuit or the load, discharge takes place between electric wires or between electrodes. If discharge occurs, a noise is superimposed on the voltage or current in the electrical circuit. The high pass filter section detects noises in a high frequency band superimposed on the voltage or current. The determination section determines whether discharge has occurred based on the noise detected by the high pass filter section. If determining that discharge has occurred, the determination section sends a signal to a cutoff section. The cutoff section changes the switch from a closed state to an open state based on the signal from the determination section. The power supply to the electrical circuit is thus interrupted.

PRIOR ART DOCUMENTS

Patent Document

Patent Document 1: Japanese Patent Application Kokai Publication No. 2019-184480

Patent Document 2: Japanese Patent Application Kokai Publication No. 2020-134231

SUMMARY OF THE INVENTION

Problems to be Solved by the Invention

In Japan, only those who hold a predetermined qualification are allowed to perform electrical engineering (Article 3, Section 1 of Electricians Act). Meanwhile, the discharge detection structure in Japanese Patent Application Kokai Publication No. 2019-184480 is electrically connected to wirings of the distribution board or indoor wirings. Installation and removal of such a discharge detection structure in wirings and from wirings fall under the electrical engineering defined in the Japanese Electricians Act. Accordingly, the discharge detection structure in Japanese Patent Application Kokai Publication No. 2019-184480 has a problem of having to be installed and removed in and from wirings only by those who hold the predetermined qualification.

Japanese Patent Application Kokai Publication No. 2020-134231 (Patent Document 2) discloses a plug-in discharge detection unit. The plug-in discharge detection unit is provided with two plugs of a cathode and an anode to receive power supply from a plug socket. Such a plug-in discharge detection unit allows anyone to readily install it by inserting the plugs into the plug socket. However, if determining that discharge has occurred, the plug-in discharge detection unit in the past has a problem of doing no more than output of the determination result, without interrupting the breaker.

The present invention has been made in view of the above problems, and it is an object thereof to provide a plug-in discharge detection unit and a discharge detection system that are capable of, if discharge occurs, interrupting a leakage breaker or capable of interrupting power supply to a load without interrupting the leakage breaker.

Means to Solve the Problems (1) A first plug-in discharge detection unit of the present invention includes two plugs of a cathode and an anode configured to allow insertion into respective two plug insertion holes of a plug socket, a discharge detection section configured to allow detection of a noise of discharge superimposed on a voltage or current, and an arithmetic section configured to allow determination of whether discharge has occurred based on the noise, the detection unit further includes: a ground terminal electrically connected to a ground; at least one first switch electrically connected to a secondary side of the plug; and a current limiting resistor electrically connected to a secondary side of the first switch, wherein the current limiting resistor has a secondary side electrically connected to the ground terminal, and the arithmetic section changes, if determining that discharge has occurred, the first switch from an open state to a closed state to pass an artificial leakage current with a current value in accordance with a resistance value of the current limiting resistor through the ground terminal.

(2) It is preferred that the plug-in discharge detection unit of (1) above further includes: at least one plug socket having at least two plug insertion holes of a cathode and an anode; at least two female terminals of a cathode and an anode provided behind the respective plug insertion holes and electrically connected to secondary sides of the respective plugs; and at least one second switch electrically connected between the plug and at least one of the female terminals, wherein the arithmetic section changes, if determining that discharge has occurred, the second switch from a closed state to an open state to cut off power supply from the plug to the female terminals.

(3) It is preferred that, in the plug-in discharge detection unit of (2) above, the arithmetic section executes, if determining that discharge has occurred, a process of changing the second switch from the closed state to the open state and later, if again determining that discharge has occurred, executes a process of changing the first switch from the open state to the closed state.

(4) It is preferred that, in the plug-in discharge detection unit of (3) above, the arithmetic section executes, if determining that discharge has occurred, the process of changing the second switch from the closed state to the open state and, if not determining that discharge has occurred while a predetermined time set in advance passes, maintains the open state of the first switch.

(5) It is preferred that the plug-in discharge detection unit of (1) above further includes: two or more plug sockets having at least two plug insertion holes of a cathode and an anode; four or more female terminals of cathodes and anodes provided behind the respective plug insertion holes and electrically connected to secondary sides of the respective plugs; and four or more second switches electrically connected between the respective female terminals and the plugs, wherein the arithmetic section changes, if determining that discharge has occurred, two of the second switches corresponding to at least one of the plug sockets or all the second switches from a closed state to an open state to cut off power supply from the plugs to the two female terminals or all the female terminals.

(6) It is preferred that the plug-in discharge detection unit of (2) above further includes a communication section configured to allow wireless communication with a computer terminal registered in advance, wherein the arithmetic section executes, if determining that discharge has occurred, a process of changing the first switch from the open state to the closed state and/or a process of changing the second switch from the closed state to the open state based on an instruction from the computer terminal received by the communication section.

(7) It is preferred that, in the plug-in discharge detection unit of (6) above, the arithmetic section executes, if not receiving the instruction from the computer terminal while a time determined in advance passes, the process of changing the first switch from the open state to the closed state.

(8) In order to achieve the above object, a second plug-in discharge detection unit of the present invention includes two plugs of a cathode and an anode configured to allow insertion into respective two plug insertion holes of a plug socket, a discharge detection section configured to allow detection of a noise of discharge superimposed on a voltage or current, and an arithmetic section configured to allow determination of whether discharge has occurred based on the noise, the detection unit further includes: at least one plug socket having at least two plug insertion holes of a cathode and an anode; at least two female terminals of a cathode and an anode provided behind the respective plug insertion holes and electrically connected to secondary sides of the respective plugs; and at least one second switch electrically connected between the plug and at least one of the female terminals, wherein the arithmetic section changes, if determining that discharge has occurred, the second switch from a closed state to an open state to cut off power supply from the plug to the female terminals.

(9) In order to achieve the above object, a discharge detection system of the present invention includes: the plug-in discharge detection unit according to any one of (1) through (7) above; a leakage breaker configured to detect a leakage current and interrupt a circuit; an indoor wiring electrically connected to a secondary side of the leakage breaker; and a plug socket having at least two plug insertion holes of a cathode and an anode and provided with at least two female terminals of a cathode and an anode behind the respective plug insertion holes, the female terminals being electrically connected to the indoor wiring, wherein the plug-in discharge detection unit causes the two plugs to be inserted into the respective plug insertion holes to be electrically connected to the female terminals of the plug socket, the arithmetic section changes, if determining that discharge has occurred, the first switch from the open state to the closed state to pass an artificial leakage current with a current value in accordance with a resistance value of the current limiting resistor through the ground terminal, and the leakage breaker detects the artificial leakage current and interrupts the circuit.

(10) It is preferred that the discharge detection system of (9) above includes: two or more of the plug-in discharge detection units; two or more of the leakage breakers; two or more of the indoor wirings electrically connected to the secondary sides of the respective leakage breakers; and two or more of the plug sockets provided with at least two of the female terminals electrically connected to the respective indoor wirings, wherein a power line to supply power to a primary side of each leakage breaker has a plurality of voltage phases, the primary sides of the respective leakage breakers are electrically connected to electric circuits of the voltage phases different from each other, and each plug-in discharge detection unit causes the two plugs to be inserted into the respective plug insertion holes to be electrically connected to the female terminals of the plug socket different from each other.

Effects of the Invention

The plug-in discharge detection unit and the discharge detection system are, if discharge occurs, capable of interrupting the leakage breaker or capable of interrupting power supply to the load without interrupting the leakage breaker.

BRIEF DESCRIPTION OF THE DRAWINGS

FIG. 8 is a perspective view illustrating a front surface, an upper surface, and a side surface of a plug-in discharge detection unit according to a second embodiment of the present invention.

FIG. 10 is a perspective view illustrating a front surface, an upper surface, and a side surface of a plug-in discharge detection unit according to a third embodiment of the present invention.

FIG. 12 is a perspective view illustrating a front surface, an upper surface, and a side surface of a plug-in discharge detection unit according to a fourth embodiment of the present invention.

FIG. 22 is a schematic diagram illustrating main circuits configured in a housing of the plug-in discharge detection unit in the fifth embodiment, where the plug-in discharge detection unit is provided with three ZCTs and three third switches and is not provided with a configuration to pass an artificial leakage current.

FIG. 26 is a schematic diagram illustrating a configuration of a first output section of the power unit.

FIG. 27A is a waveform diagram illustrating the +5 V direct current power supply generated by the first voltage generation section of the power unit, and FIG. 27B is a waveform diagram illustrating a direct current power supply inverted from +5 V to −5 V by a second voltage generation section of the power unit.

FIG. 28A is a waveform diagram illustrating a noise of discharge superimposed on a 100 V alternating current power supply, and FIG. 28B is a waveform diagram illustrating a noise extracted from a ±5 V direct current power supply by a filter section of the discharge detection section.

FIG. 29 is a table illustrating correspondence of the states of the ±5 V direct current power supply to reporting modes by the first output section of the power unit.

DESCRIPTION OF THE INVENTION

The plug-in discharge detection unit and the discharge detection system according to embodiments of the present invention are described below with reference to the drawings.

1. First Embodiment

At first, a description is given to the plug-in discharge detection unit and the discharge detection system according to the first embodiment of the present invention with reference to FIGS. 1 through 7C.

Figure 1:
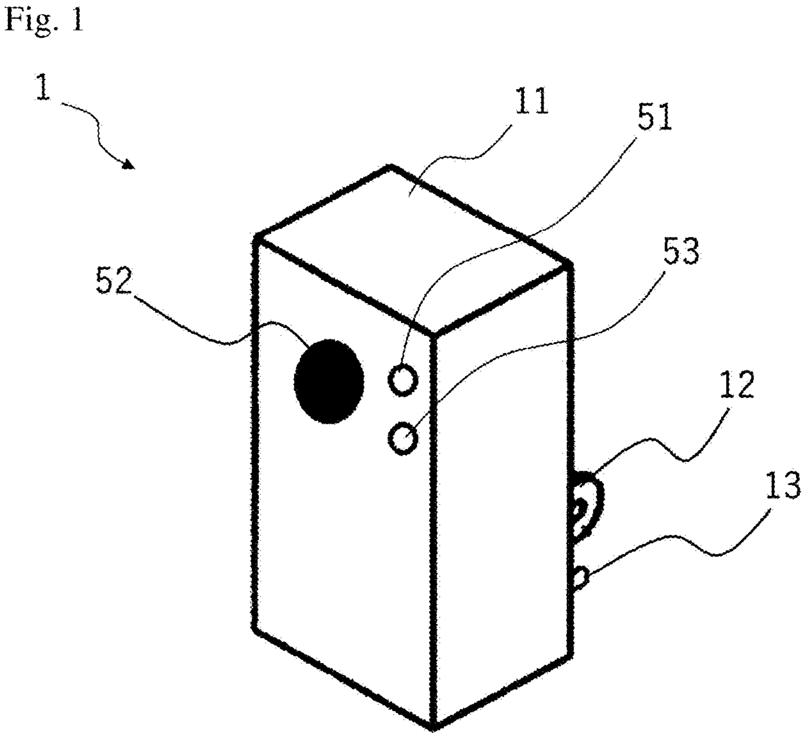
FIG. 1 is a perspective view illustrating a front surface, an upper surface, and a side surface of a plug-in discharge detection unit according to a first embodiment of the present invention.
Figure 2:
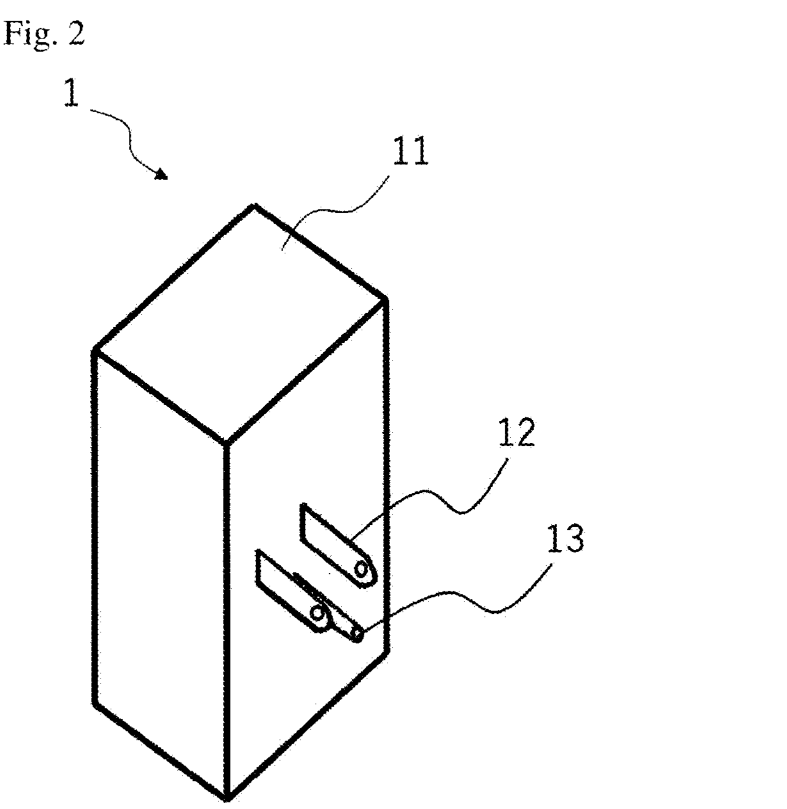
FIG. 2 is a perspective view illustrating a rear surface, the upper surface, and the side surface of the plug-in discharge detection unit in the first embodiment.

FIGS. 1 and 2 illustrate external views of a plug-in discharge detection unit 1 according to the first embodiment. The plug-in discharge detection unit 1 is provided with a rectangular parallelepiped housing 11. As illustrated in FIG. 1, the housing 11 has a front surface provided with an LED 51, a speaker 52, and a test button 53. The LED 51 visually reports ON/OFF, occurrence of discharge, and the like of the plug-in discharge detection unit 1 by the mode, such as lighting on, lighting out, and blinking. The speaker 52 outputs an alarm sound when discharge occurs. The test button 53 is turned on to check the operation of the plug-in discharge detection unit 1. It should be noted that the LED 51, the speaker 52, and the test button 53 may be provided on a surface other than the front surface of the housing 11.

Figure 4:
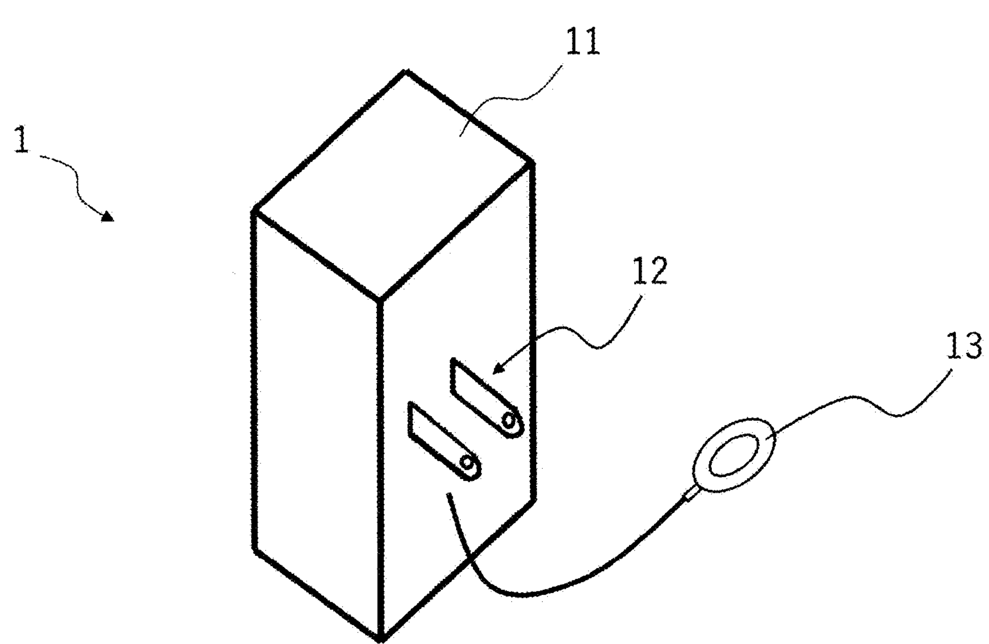
FIG. 4 is a perspective view illustrating a rear surface, an upper surface, and a side surface of the plug-in discharge detection unit in the first embodiment with a changed ground terminal.
Figure 5:
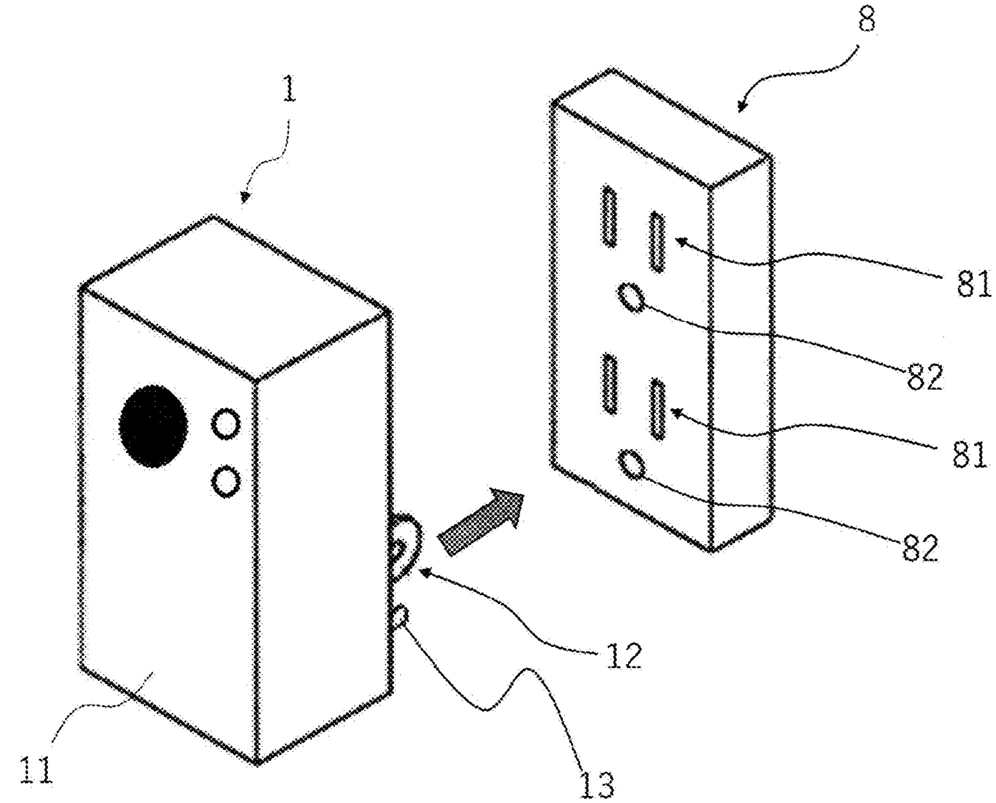
FIG. 5 is a perspective view illustrating the plug-in discharge detection unit in the first embodiment and a plug socket.

As illustrated in FIG. 2, the housing 11 has a rear surface provided with two plugs 12 of the cathode and anode and a ground terminal 13. As illustrated in FIG. 5, the two plugs 12 and the ground terminal 13 are inserted into two plug insertion holes 81 and a ground insertion hole 82 of a plug socket 8. The plug socket 8 is provided with female terminals, not shown, respectively behind the two plug insertion holes 81 and the ground insertion hole 82. The respective two female terminals corresponding to the two plug insertion holes 81 are electrically connected to indoor wirings, not shown. Meanwhile, the one female terminal corresponding to the ground insertion hole 82 is electrically connected to the ground. The two plugs 12 and the ground terminal 13 are inserted into the two plug insertion holes 81 and the ground insertion hole 82 and are electrically connected to the three female terminals. In other words, the plug-in discharge detection unit 1 is electrically connected to the indoor wirings, not shown, via the plug socket 8. It should be noted that the ground terminal 13 illustrated in FIG. 2 is a pin protruding from the rear surface of the housing 11. The ground terminal 13 is, however, not limited to the form of a pin. For example, as illustrated in FIG. 4, the ground terminal 13 may be a flat crimp terminal. The crimp terminal is electrically connected to a lead wire drawn from the rear surface of the housing 11.

Figure 3:
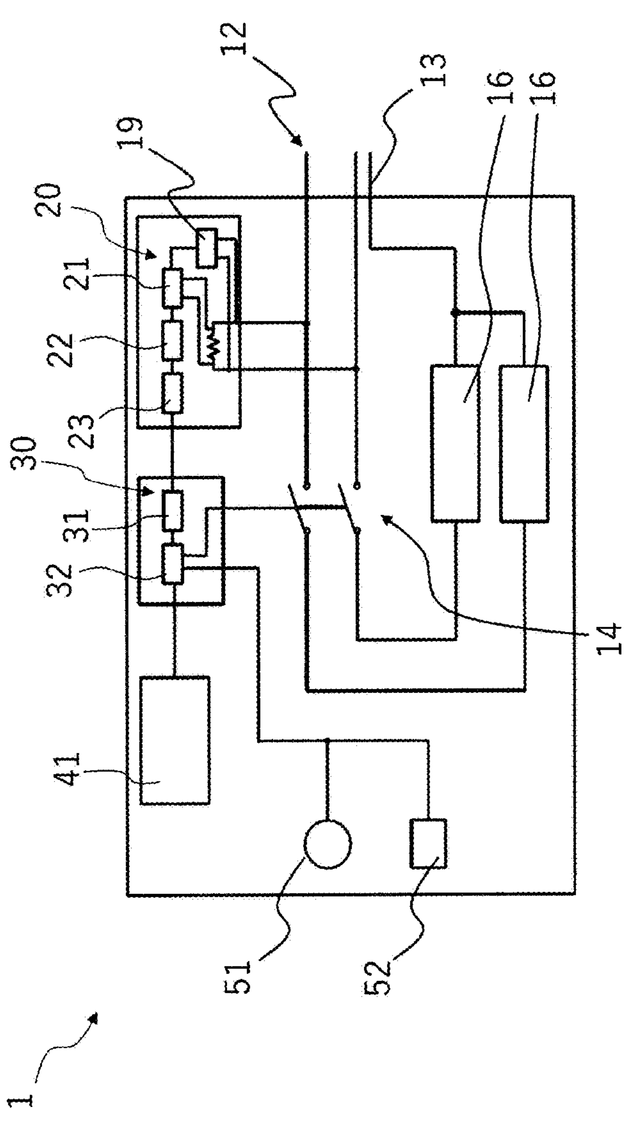
FIG. 3 is a schematic diagram illustrating main circuits configured in a housing of the plug-in discharge detection unit in the first embodiment.

FIG. 3 illustrates circuits of the plug-in discharge detection unit 1 configured in the housing 11. The circuits of the plug-in discharge detection unit 1 are mainly configured with the two plugs 12, the ground terminal 13, two first switches 14, two current limiting resistors 16, a discharge detection section 20, an arithmetic section 30, a communication section 41, the LED 51, and the speaker 52.

The two plugs 12 are electrically connected to the respective two first switches 14. The two first switches 14 are electrically connected to the respective two current limiting resistors 16. Both the two current limiting resistors 16 are electrically connected to the ground terminal 13. In a normal state where discharge does not occur, both the two first switches 14 maintain an open state. While the two first switches 14 are in the open state, the current does not flow to the secondary side of the two first switches 14. When discharge occurs, the two first switches 14 are changed from the open state to the closed state. While the two first switches 14 are in the closed state, an artificial leakage current flows to the ground terminal 13. The artificial leakage current has a current value in accordance with resistance values of the current limiting resistors 16. Such an artificial leakage current plays a role of interrupting a leakage breaker described later. The current limiting resistors 16 preferably have high resistance values to cause the artificial leakage current to have a current value of several mA. This is because a general leakage breaker is operated by a leakage current of several mA.

The discharge detection section 20 is mainly configured with a power supply section 19, a filter section 21, an amplification section 22, and a smoothing section 23. The power supply section 19 is electrically connected to the two plugs 12. The power supply section 19 supplies power to the circuits in the housing 11. It should be noted that the power supply section 19 is not an essential component of the discharge detection section 20 and may be provided separate from the circuit board on which the discharge detection section 20 is implemented. The power supply section 19 may be electrically connected to the primary sides of the respective at least two switches 14. The filter section 21 is, for example, an RC circuit and has a configuration where a capacitor and a resistor are connected in series. The filter section 21 is electrically connected between the two plugs 12, that is, between the plug 12 of the cathode and the plug 12 of the anode. In this situation, if discharge occurs in an indoor wiring or a load, a noise in a high frequency band is superimposed on the voltage or current. The filter section 21 passes noise components at a predetermined frequency or more to detect discharge. The amplification section 22 amplifies the noise having passed through the filter section 21. The smoothing section 23 smooths the waveform of the noise amplified by the amplification section 22. The smoothing is, for example, a process of connecting peaks in the waveform of the amplified noise.

The arithmetic section 30 is configured with a determination section 31 and an output processing section 32. Examples of the determination section 31 to be used include arithmetic devices, such as a microcontroller unit (MCU) and a microcomputer. The determination section 31 determines whether discharge has occurred based on the noise waveform smoothed by the smoothing section 23. For example, the determination section 31 determines whether the noise level is more than a threshold. If the noise level is more than the threshold, the determination section 31 determines that discharge has occurred. The output processing section 32 is electrically connected respectively to the two first switches 14, the communication section 41, the LED 51, and the speaker 52. The output processing section 32 outputs a signal to each of the two first switches 14, the communication section 41, the LED 51, and the speaker 52 based on the determination result of the determination section 31.

For example, the output processing section 32 changes the two first switches 14 from the open state to the closed state based on the determination result that discharge has occurred. This causes an artificial leakage current to flow to the ground terminal 13. The output processing section 32 also causes the LED 51 to be lit up in a predetermined mode, based on the determination result that discharge has occurred, and causes the speaker 52 to output an alarm sound. Moreover, the output processing section 32 outputs a signal to the communication section 41 based on the determination result that discharge has occurred. The communication section 41 has a configuration allowing communication with external devices. The communication section 41 informs an external device that, for example, discharge has occurred.

Figure 6:
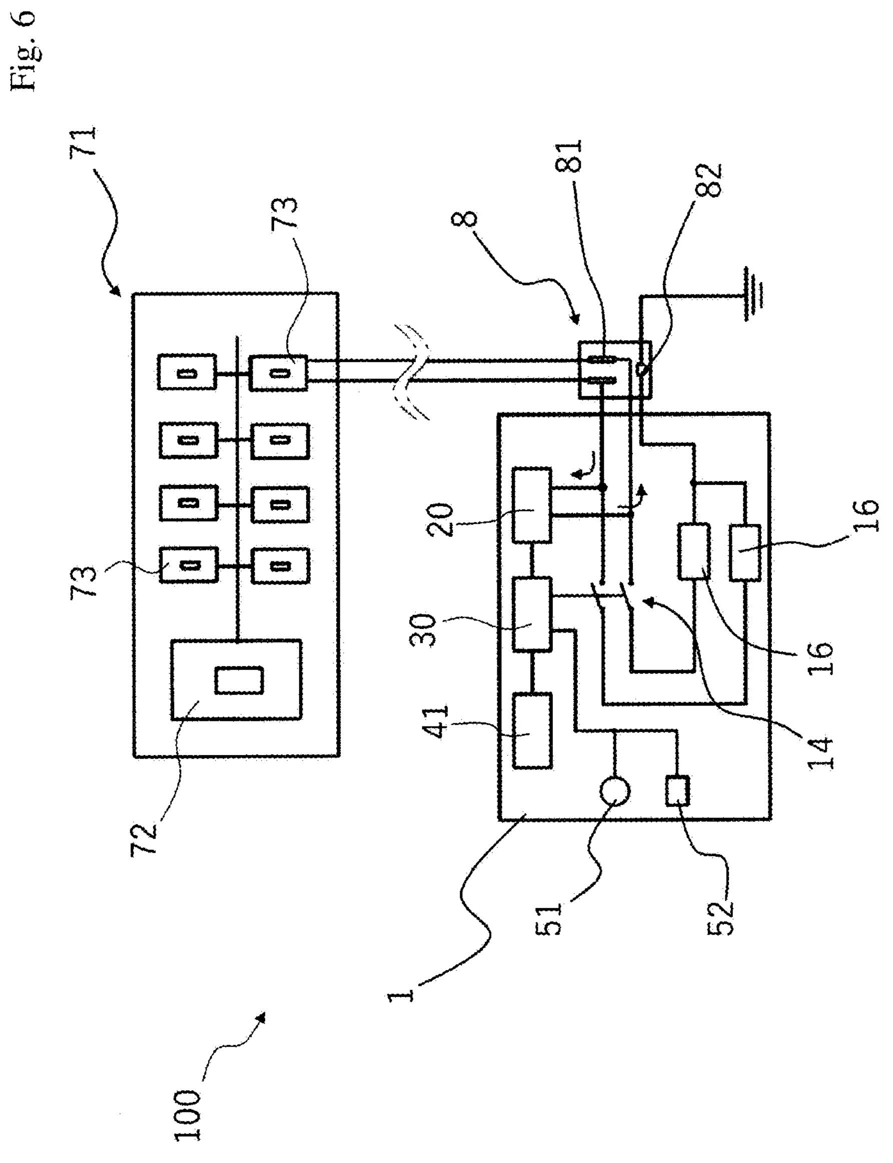
FIG. 6 is a schematic diagram illustrating main circuits of a discharge detection system according to the first embodiment of the present invention.

FIG. 6 illustrates circuits of a discharge detection system 100 according to the first embodiment of the present invention. The plug-in discharge detection unit 1 described above is electrically connected to the plug socket 8 illustrated in FIG. 5 to configure the discharge detection system 100 together with the indoor wirings and a distribution board 71. As illustrated in FIG. 6, the distribution board 71 is provided with a main breaker 72 and a plurality of branch breakers 73. In the present embodiment, all the main breaker 72 and the branch breakers 73 are leakage breakers and have a function of detecting a leakage current and interrupting the circuits.

The plug-in discharge detection unit 1 is electrically connected to one of the branch breakers 73 via the plug socket 8 and the indoor wirings. If discharge occurs, the plug-in discharge detection unit 1 changes the two first switches 14 from the open state to the closed state. This causes an artificial leakage current to flow to the ground terminal 13 of the plug-in discharge detection unit 1. The one branch breaker 73 detects the artificial leakage current and interrupts the circuit. As a result, the power supply to the indoor wiring electrically connected to the secondary side of the one branch breaker 73 is cut off. Meanwhile, both the main breaker 72 and the branch breakers 73 other than the one branch breaker 73 are not interrupted and the power supply is maintained.

When all the branch breakers 73 are leakage breakers as in the present embodiment, the circuits of the discharge detection system 100 are configured by electrically connecting the plug-in discharge detection unit 1 to any plug socket 8 provided in a building. It should be noted that, in order to configure the discharge detection system 100, not all the main breaker 72 and the branch breakers 73 have to be leakage breakers. For example, the discharge detection system 100 is configured by providing a leakage breaker as only one of the branch breakers 73 electrically connected to the plug-in discharge detection unit 1. As another example, the discharge detection system 100 is configured by providing a leakage breaker as the main breaker 72 only. In the case of providing only the main breaker 72 as a leakage breaker, an artificial leakage current causes cutoff of the power supply to the indoor wirings electrically connected to the secondary sides of all the branch breakers 73.

Figures 7A, 7B, 7C:
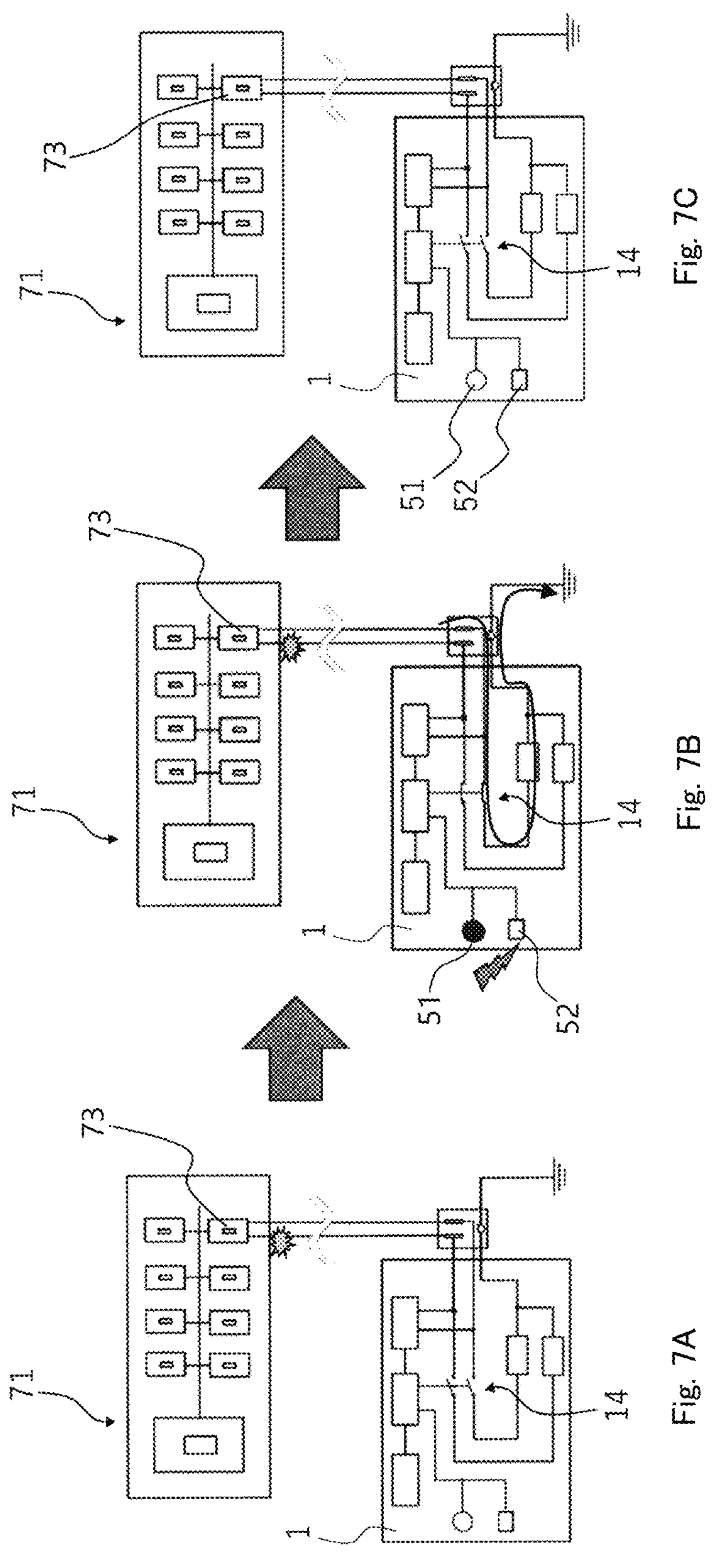
FIGS. 7A through 7C are schematic diagrams illustrating a behavioral flow of the discharge detection system in the first embodiment.

FIGS. 7A through 7C illustrate a behavioral flow of the discharge detection system 100 in the present embodiment. As illustrated in FIG. 7A, it is assumed that discharge has occurred in an indoor wiring electrically connected to the secondary side of one of the branch breakers 73. Then, as illustrated in FIG. 7B, the plug-in discharge detection unit 1 determines that discharge has occurred and changes the two first switches 14 from the open state to the closed state. This causes an artificial leakage current illustrated by an arrow in FIG. 7B to flow to the ground terminal 13. The one branch breaker 73 detects the artificial leakage current and interrupts the circuit. As a result, the power supply to the indoor wiring electrically connected to the secondary side of the one branch breaker 73 is cut off. As illustrated in FIG. 7C, the cutoff of the power supply causes the respective two first switches 14 of the plug-in discharge detection unit 1 to be changed from the closed state to the open state. It should be noted that the two first switches 14 may be configured to maintain the closed state even after the cutoff of the power supply.

2. Second Embodiment

Figure 8:
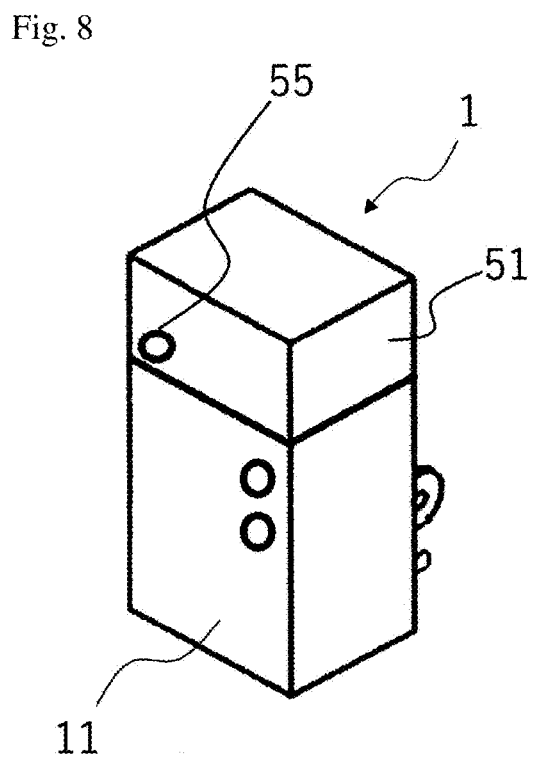
Figure 9:
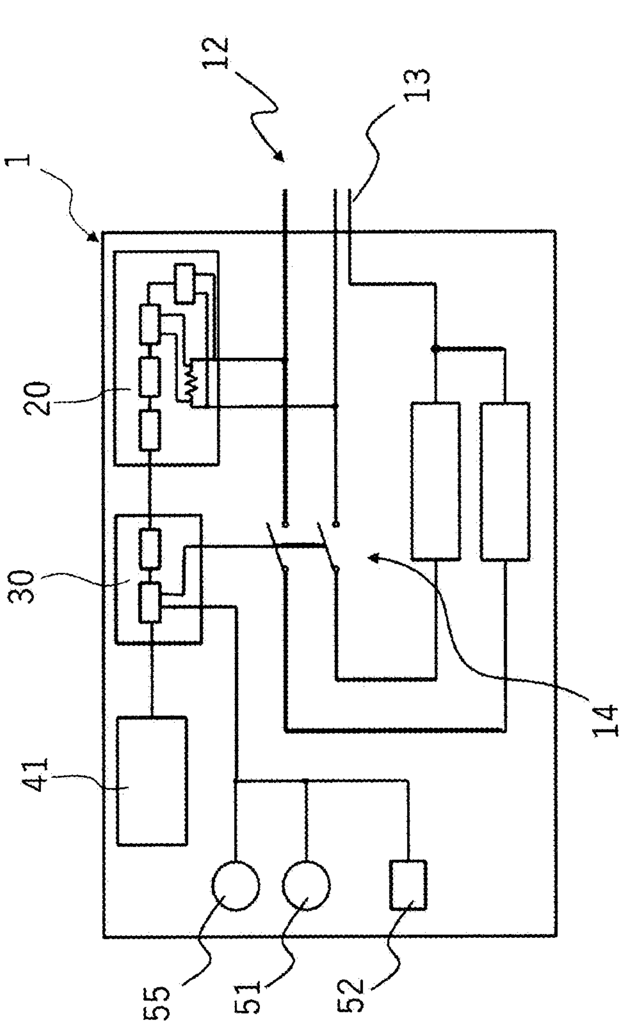
FIG. 9 is a schematic diagram illustrating main circuits configured in a housing of the plug-in discharge detection unit in the second embodiment.

As described above, while having the function of detecting discharge and the function of interrupting the leakage breaker(s), the plug-in discharge detection unit 1 may have an additional function. FIGS. 8 and 9 illustrate a plug-in discharge detection unit 1 according to the second embodiment of the present invention. The plug-in discharge detection unit 1 in the present embodiment includes a night light configured with the LED 51 and a sensor 55. As illustrated in FIG. 8, an upper portion of the housing 11 of the plug-in discharge detection unit 1 is configured with a translucent synthetic resin cover. The LED 51 illustrated in FIG. 9 is provided inside the cover. The sensor 55 illustrated in FIG. 9 is provided outside the cover. The sensor 55 is, for example, a motion sensor or a light intensity sensor. The motion sensor detects, for example, infrared rays emitted by a person. The sensor 55 as a motion sensor detects a person coming close to the plug-in discharge detection unit 1 and causes the LED 51 to be lit up. Meanwhile, the light intensity sensor detects the surrounding brightness. The sensor 55 as the light intensity sensor causes the LED 51 to be lit up when the surroundings of the plug-in discharge detection unit 1 become dark. The sensor 55 as the light intensity sensor also causes the LED 51 to be lit out when the surroundings of the plug-in discharge detection unit 1 become bright. Similar to the first embodiment, if determining that discharge has occurred, the plug-in discharge detection unit 1 causes, for example, the LED 51 to blink to visually report the occurrence of discharge. In such a manner, the lighting mode of the LED 51 if discharge occurs is preferably different from the lighting mode of the LED 51 while functioning as a night light. A user can thus intuitively understand that discharge has occurred by looking at the lighting mode of the LED 51.

3. Third Embodiment

Figure 10:
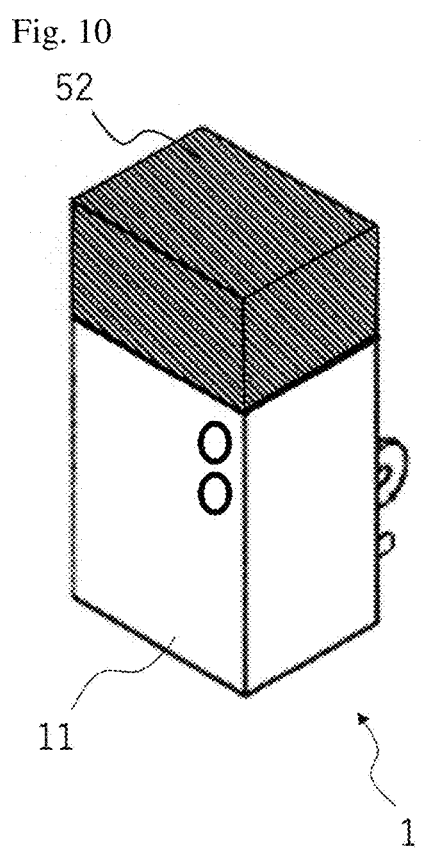
Figure 11:
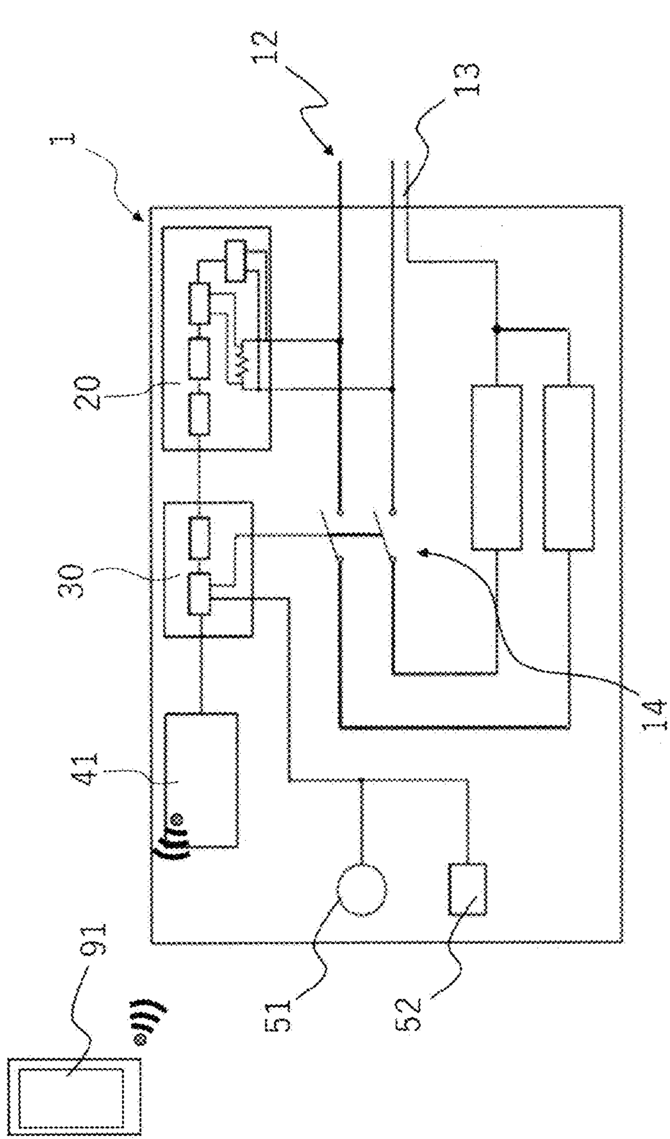
FIG. 11 is a schematic diagram illustrating main circuits configured in a housing of the plug-in discharge detection unit in the third embodiment.

FIGS. 10 and 11 illustrate a plug-in discharge detection unit 1 according to the third embodiment of the present invention. The plug-in discharge detection unit 1 in the present embodiment includes a wireless speaker configured with a communication section 41 and a speaker 52. As illustrated in FIG. 10, an upper portion of the housing 11 of the plug-in discharge detection unit 1 is covered with a resin mesh screen, which is excellent in the sound passage performance. The speaker 52 is provided inside the resin mesh screen. As illustrated in FIG. 11, the communication section 41 is capable of wireless communication with a computer terminal 91, such as a personal computer, a tablet computer, a smartphone, and a portable digital audio player, for example. Examples of the mode of wireless communication include Wi-Fi® and Bluetooth®. A signal sent from the computer terminal 91 is received by the communication section 41 and processed by the arithmetic section 30. The arithmetic section 30 causes the speaker 52 to output a sound based on the signal received from the computer terminal 91. However, if determining that discharge has occurred, the arithmetic section 30 interrupts the processing of the signal received from the computer terminal 91 and causes the speaker 52 to output an alarm sound.

It should be noted that the plug-in discharge detection unit 1 in the present embodiment may be remotely operated by the computer terminal 91. For example, the volume of the sound output from the speaker 52 and the intensity of the light of the LED 51 may be adjusted by the computer terminal 91 via the wireless communication. This allows a user to remotely operate the plug-in discharge detection unit 1 even if the plug-in discharge detection unit 1 is inserted into a plug socket 8 that is beyond the reach of the user.

4. Fourth Embodiment

Figure 12:
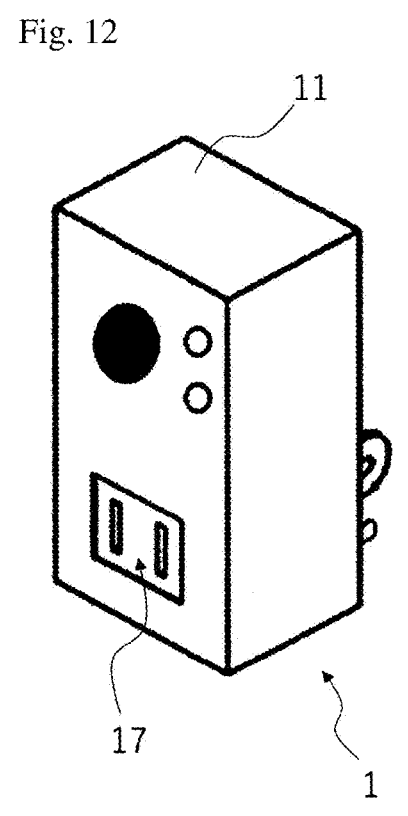
Figure 13:
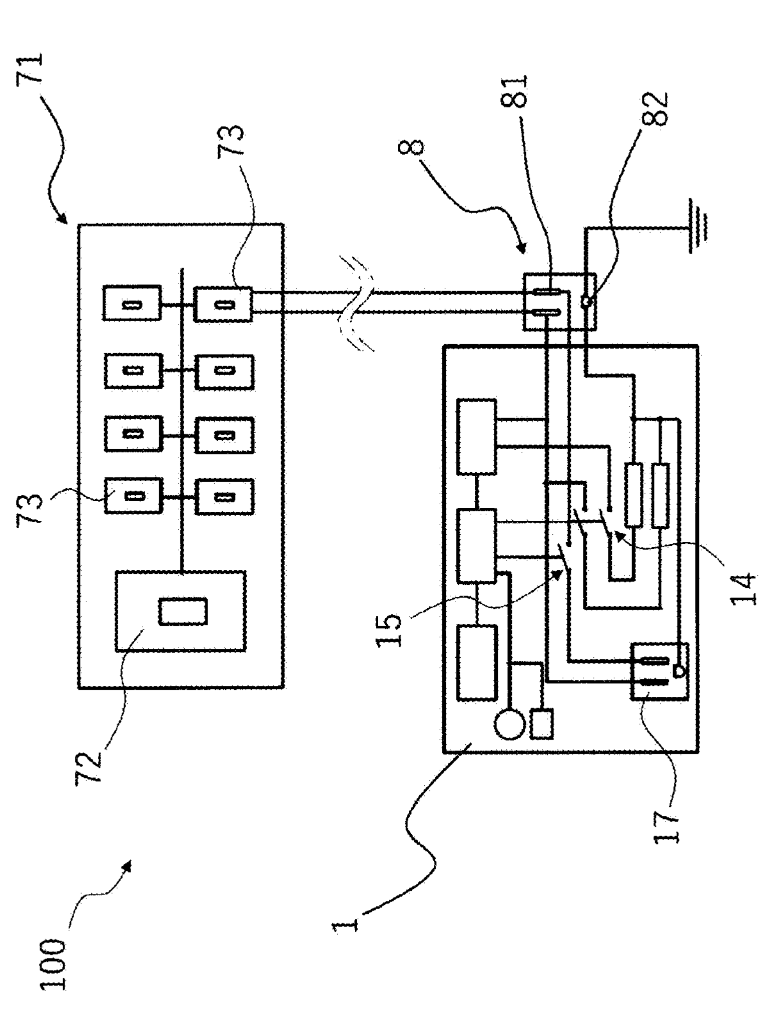
FIG. 13 is a schematic diagram illustrating main circuits of the discharge detection system according to the fourth embodiment of the present invention.

FIGS. 12 and 13 illustrate a plug-in discharge detection unit 1 according to the fourth embodiment of the present invention. The plug-in discharge detection unit 1 in the present embodiment includes one plug socket 17. As illustrated in FIG. 12, the plug socket 17 is provided in a lower portion on the front surface of a housing 11 of the plug-in discharge detection unit 1. The plug socket 17 is electrically connected to a load, not shown.

As illustrated in FIG. 13, the plug socket 17 is provided with two plug insertion holes and a ground insertion hole. Although not shown, female terminals to receive the plugs and the ground terminal are provided respectively behind the two plug insertion holes and the ground insertion hole. The female terminals corresponding to the respective two plug insertion holes are electrically connected to the respective two plugs 12 of the plug-in discharge detection unit 1. The female terminal corresponding to the ground insertion hole is electrically connected to the ground terminal 13 of the plug-in discharge detection unit 1. In this situation, one of the female terminals corresponding to the respective two plug insertion holes is electrically connected to one of the plugs 12 of the plug-in discharge detection unit 1 via a second switch 15. The second switch 15 is electrically connected to the output processing section 32 (refer to FIG. 3) of the arithmetic section 30. If determining that discharge has occurred, the arithmetic section 30 changes the second switch 15 from a closed state to an open state. Thus, the power supply to the load electrically connected to the plug socket 17 is cut off.

Figures 14A, 14B, 14C:
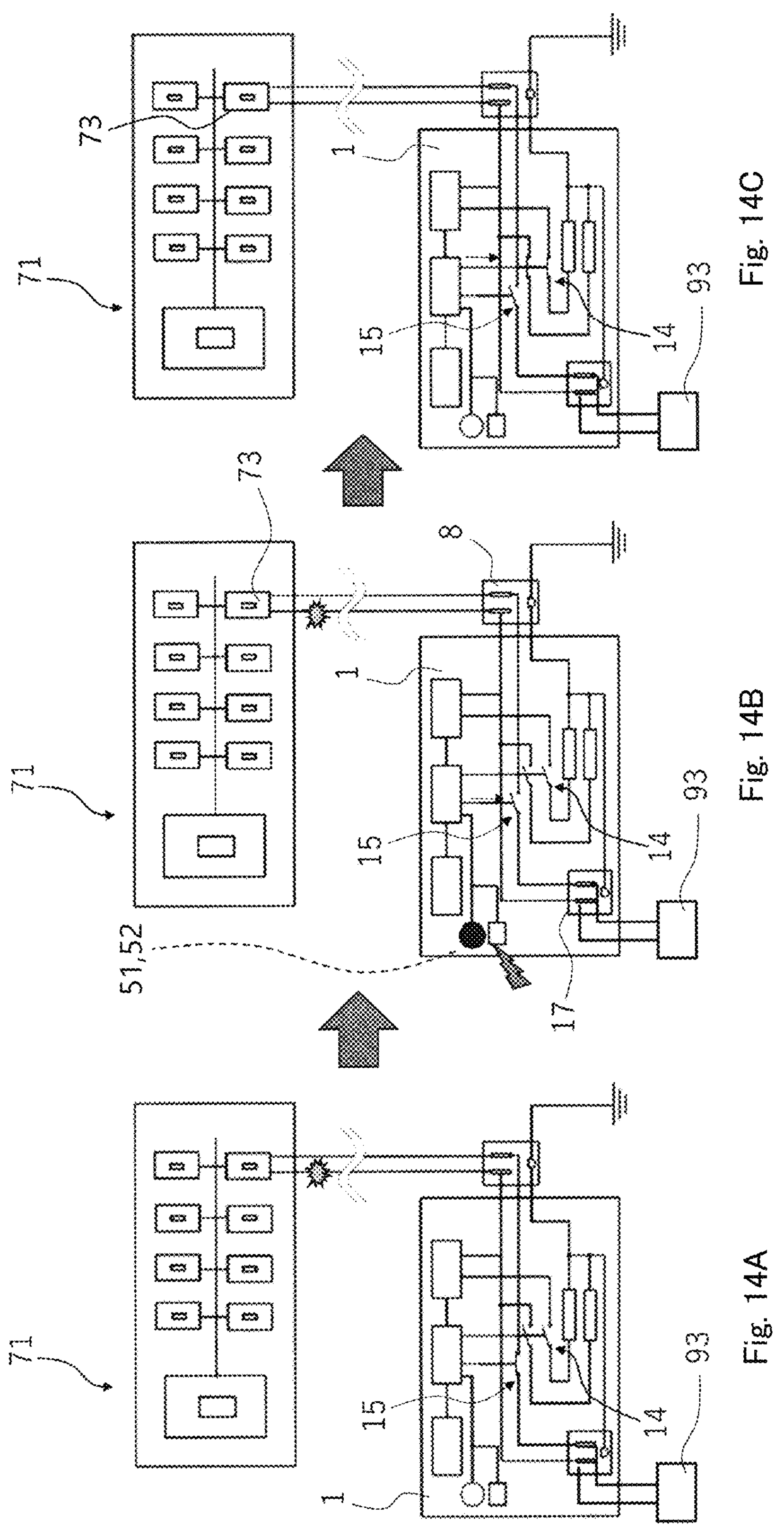
FIGS. 14A through 14C are schematic diagrams illustrating a behavioral flow of the discharge detection system in the fourth embodiment.

If determining that discharge has occurred, the plug-in discharge detection unit 1 in the present embodiment causes the second switch 15 and the two first switches 14 to operate with a delay. FIGS. 14A through 14C illustrate a behavioral flow of a discharge detection system 100 in the present embodiment.

As illustrated in FIG. 14A, in a normal state where discharge does not occur, the second switch 15 is in the closed state and both the two first switches 14 are in the open state. In other words, the power is supplied to a load 93 electrically connected to the plug socket 17 of the plug-in discharge detection unit 1. In addition, the plug-in discharge detection unit 1 does not pass an artificial leakage current.

As illustrated in FIG. 14B, it is assumed that discharge has occurred in an indoor wiring electrically connected to the secondary side of one of the branch breakers 73. Then, the plug-in discharge detection unit 1 determines that discharge has occurred and changes the second switch 15 from the closed state to the open state. Thus, the power supply to the load 93 electrically connected to the plug socket 17 is cut off. At this point, both the two first switches 14 are in the open state and an artificial leakage current does not flow.

If the discharge continues after the second switch 15 turns into the open state, as illustrated in FIG. 14C, the plug-in discharge detection unit 1 changes the two first switches 14 from the open state to the closed state. This causes an artificial leakage current to flow to the ground terminal 13 of the plug-in discharge detection unit 1. The one branch breaker 73 detects the artificial leakage current and interrupts the circuit. As a result, the power supply to the indoor wiring electrically connected to the secondary side of the one branch breaker 73 is cut off.

As described above, if determining that discharge has occurred, the plug-in discharge detection unit 1 in the present embodiment causes the second switch 15 to turn into the open state to cut off the power supply to the load 93 electrically connected to the plug socket 17. If the discharge continues later, the plug-in discharge detection unit 1 changes the two first switches 14 from the open state to the closed state to interrupt one of the branch breakers 73 and to cut off the power supply to the indoor wiring. In such a manner, the plug-in discharge detection unit 1 in the present embodiment is capable of stepwise widening the range of cutting off the power supply in accordance with the duration of discharge.

Figures 15A, 15B, 15C:
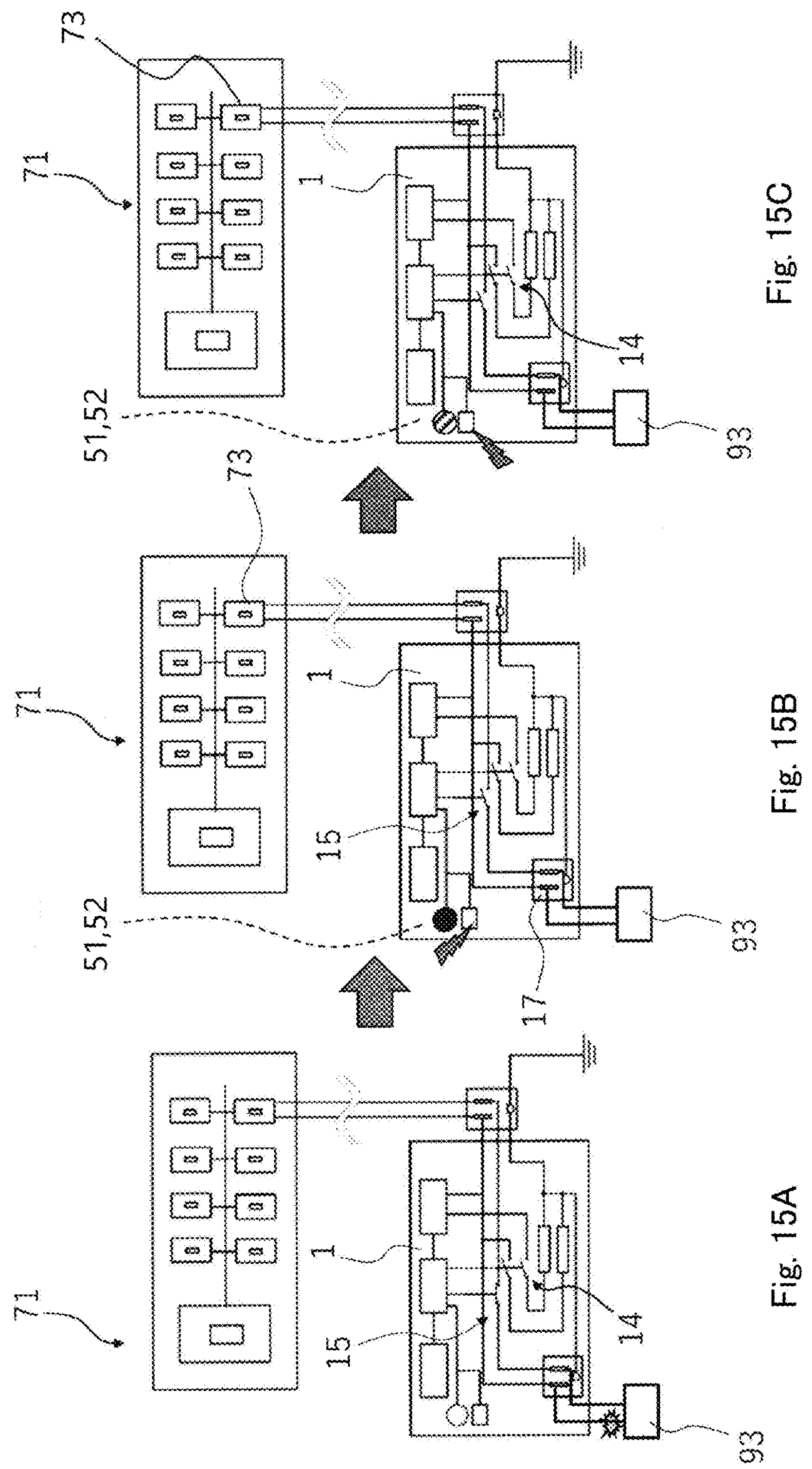
FIGS. 15A through 15C are schematic diagrams illustrating a behavioral flow of the discharge detection system in the fourth embodiment.

FIGS. 15A through 15C illustrate a behavioral flow of the discharge detection system 100 in the case that the discharge discontinues after the second switch 15 has been turned into the open state. As illustrated in FIG. 15A, it is assumed that discharge has occurred in the load 93 electrically connected to the plug socket 17 of the plug-in discharge detection unit 1. Then, as illustrated in FIG. 15B, the plug-in discharge detection unit 1 determines that discharge has occurred and changes the second switch 15 from the closed state to the open state. Thus, the power supply to the load 93 electrically connected to the plug socket 17 is cut off. As illustrated in FIG. 15C, the plug-in discharge detection unit 1 then determines whether discharge has occurred. If not determining that discharge has occurred while a time determined in advance passes, the plug-in discharge detection unit 1 maintains the open state of the two first switches 14. In other words, in the case that the discharge discontinues after the second switch 15 has been turned into the open state, the plug-in discharge detection unit 1 maintains the power supply to the indoor wirings without interrupting the one branch breaker 73. Thus, only the power supply to the load 93 in which discharge has occurred is cut off and the power supply to the components other than the load 93 is maintained. That is, the plug-in discharge detection unit 1 in the present embodiment is capable of minimizing the range of cutting off the power supply.

It should be noted that, as illustrated in FIG. 15C, if not determining that discharge has occurred while the time determined in advance passes, the plug-in discharge detection unit 1 may change the reporting modes by the LED 51, the speaker 52, and the communication section 41. That is, in the case that the discharge discontinues after the second switch 15 has been turned into the open state, the reports by the LED 51, the speaker 52, and the communication section 41 may be turned into the modes of attracting the user's attention, not the modes of letting the user know that discharge has occurred.

Figures 16A, 16B, 16C:
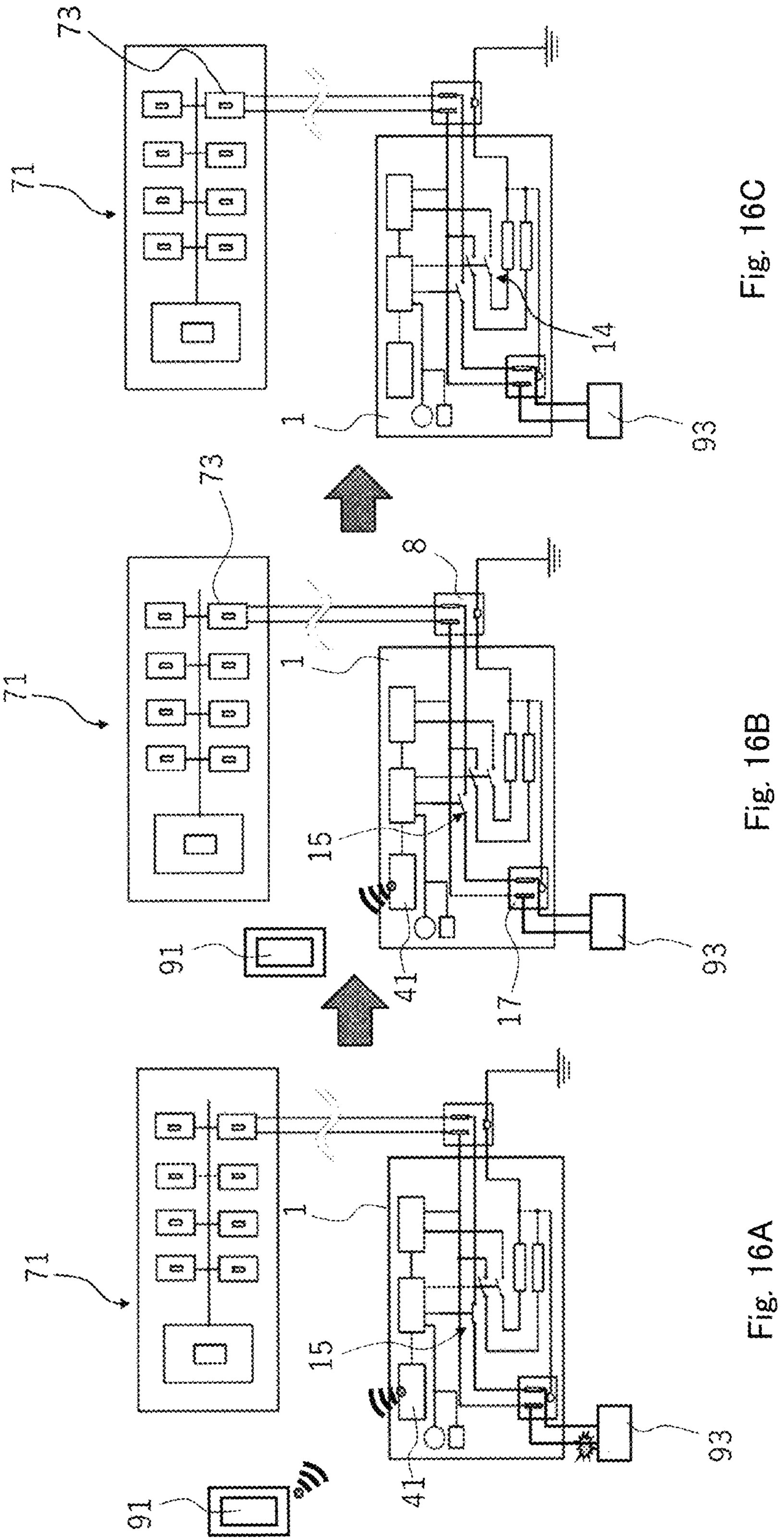
FIGS. 16A through 16C are schematic diagrams illustrating a behavioral flow of the discharge detection system in the fourth embodiment.

As illustrated in FIGS. 16A through 16C, the plug-in discharge detection unit 1 may change the two first switches 14 and/or the second switch 15 based on an instruction by the computer terminal 91.

As illustrated in FIG. 16A, it is assumed that discharge has occurred in the load 93 electrically connected to the plug socket 17 of the plug-in discharge detection unit 1. The plug-in discharge detection unit 1 determines that discharge has occurred. In this case, the plug-in discharge detection unit 1 outputs a determination result that the discharge has occurred and also starts keeping a time determined in advance. The communication section 41 sends a signal to the computer terminal 91 based on the determination result that the discharge has occurred.

In the computer terminal 91, application software to control the plug-in discharge detection unit 1 is installed. The computer terminal 91 informs the user that the discharge has occurred based on the signal received from the communication section 41. At this point, the computer terminal 91 requests a user instruction on whether to cut off the power supply to the plug socket 17 of the plug-in discharge detection unit 1.

As illustrated in FIG. 16B, if receiving an instruction from the computer terminal 91 while the time determined in advance passes, the plug-in discharge detection unit 1 operates in accordance with this instruction. That is, if receiving an instruction to cut off the power supply to the plug socket 17 of the plug-in discharge detection unit 1, the plug-in discharge detection unit 1 changes the second switch 15 from the closed state to the open state. Thus, the power supply to the load 93 electrically connected to the plug socket 17 is cut off. Meanwhile, if receiving an instruction not to cut off the power supply to the plug socket 17 of the plug-in discharge detection unit 1, the plug-in discharge detection unit 1 maintains the closed state of the second switch 15. Moreover, if there is no instruction from the computer terminal 91, the plug-in discharge detection unit 1 changes the second switch 15 from the closed state to the open state when the time determined in advance has passed. Thus, the power supply to the load 93 electrically connected to the plug socket 17 is cut off.

As illustrated in FIG. 16C, if the discharge continues after the second switch 15 has been turned into the open state, the plug-in discharge detection unit 1 waits for an instruction from the computer terminal 91 similar to above and determines whether to change the two first switches 14 from the open state to the closed state. If there is no instruction from the computer terminal 91, the plug-in discharge detection unit 1 changes the two first switches 14 from the open state to the closed state when the time determined in advance has passed. This causes an artificial leakage current to flow to the ground terminal 13 of the plug-in discharge detection unit 1. One of the branch breakers 73 detects the artificial leakage current and interrupts the circuit. As a result, the power supply to the indoor wiring electrically connected to the secondary side of the one branch breaker 73 is cut off.

The plug-in discharge detection unit 1 in the present embodiment allows a user to select whether to cut off the power supply when discharge occurs. A forced shutoff of a device undesired by the user is thus avoided. In addition, if there is no instruction from the user, the plug-in discharge detection unit 1 in the present embodiment executes the process to cut off the power supply. This allows secure prevention of accidents due to the discharge even if the user cannot respond to the information that the discharge has occurred.

Figure 17:
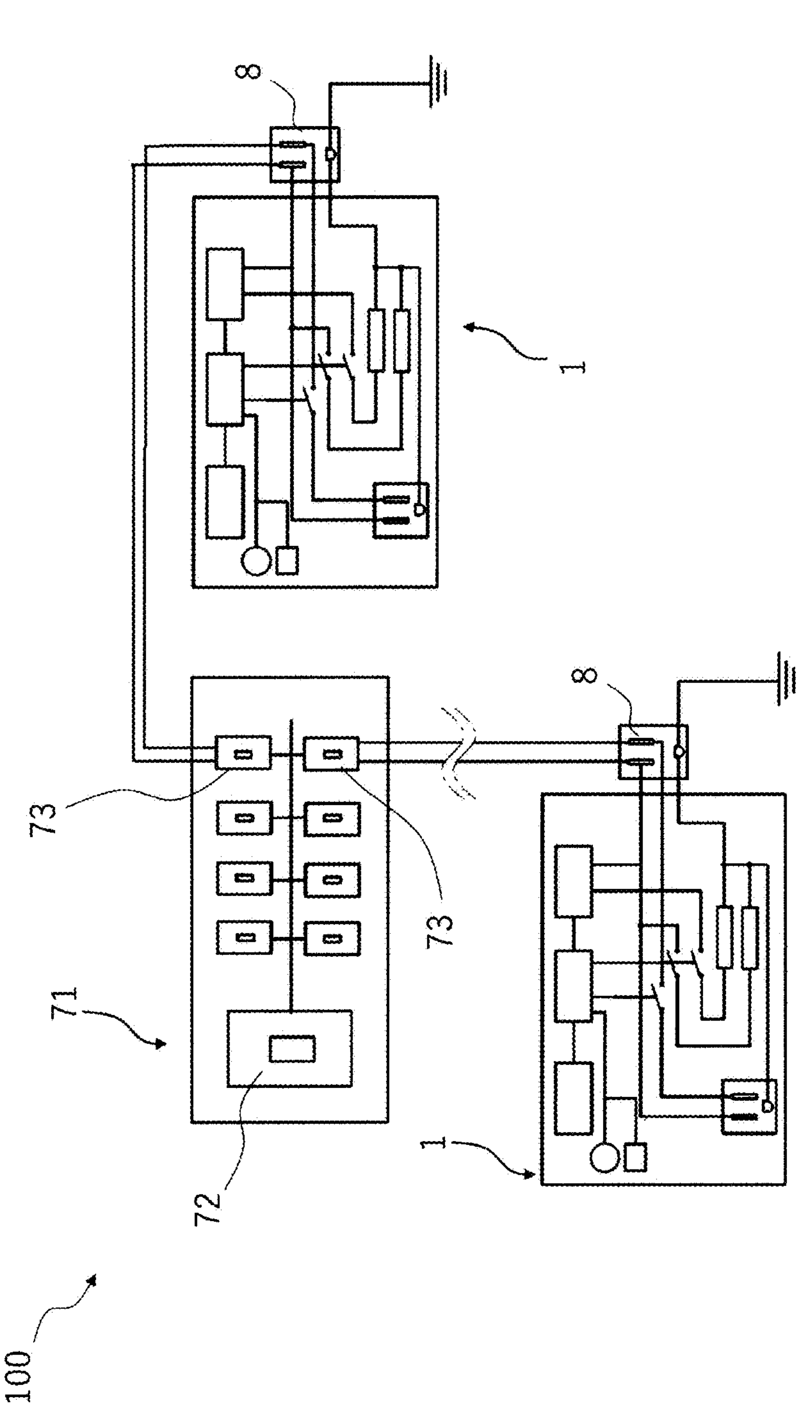
FIG. 17 is a schematic diagram illustrating main circuits of the discharge detection system in the fourth embodiment, where the discharge detection system is provided with two plug-in discharge detection units.

By the way, the distribution board 71 in the present embodiment receives the utility power supply through a power line of a 3P2E system. The power line of the 3P2E system is configured with electric circuits of two voltage phases L1 and L2 and an electric circuit of one neutral phase N. Although not shown, the plurality of branch breakers 73 is electrically connected to either electric circuit of the two voltage phases L1 or L2 inside the distribution board 71. For example, eight branch breakers 73 illustrated in FIG. 17 are distributed to two groups. Each of the four branch breakers 73 belonging to the first group is electrically connected to the electric circuit of the voltage phase L1 and the electric circuit of the neutral phase N. Each of the four branch breakers 73 belonging to the second group is electrically connected to the electric circuit of the voltage phase L2 and the electric circuit of the neutral phase N.

Meanwhile, the plug-in discharge detection unit 1 in the present embodiment is configured to comply with the 2-pole 1-element configured with the one voltage phase L and the one neutral phase N. Accordingly, each plug-in discharge detection unit 1 is only capable of detecting discharge having occurred in one of the two voltage phases L1 and L2. Therefore, as illustrated in FIG. 17, the discharge detection system 100 preferably includes at least two plug-in discharge detection units 1. The first plug-in discharge detection unit 1 is inserted into a plug socket 8 electrically connected to the indoor wirings of the voltage phase L1 and the neutral phase N. The second plug-in discharge detection unit 1 is inserted into a plug socket 8 electrically connected to the indoor wirings of the voltage phase L2 and the neutral phase N. The two plug-in discharge detection units 1 allows detection of discharge occurred in both the two voltage phases L1 and L2.

5. Fifth Embodiment

Figure 18:
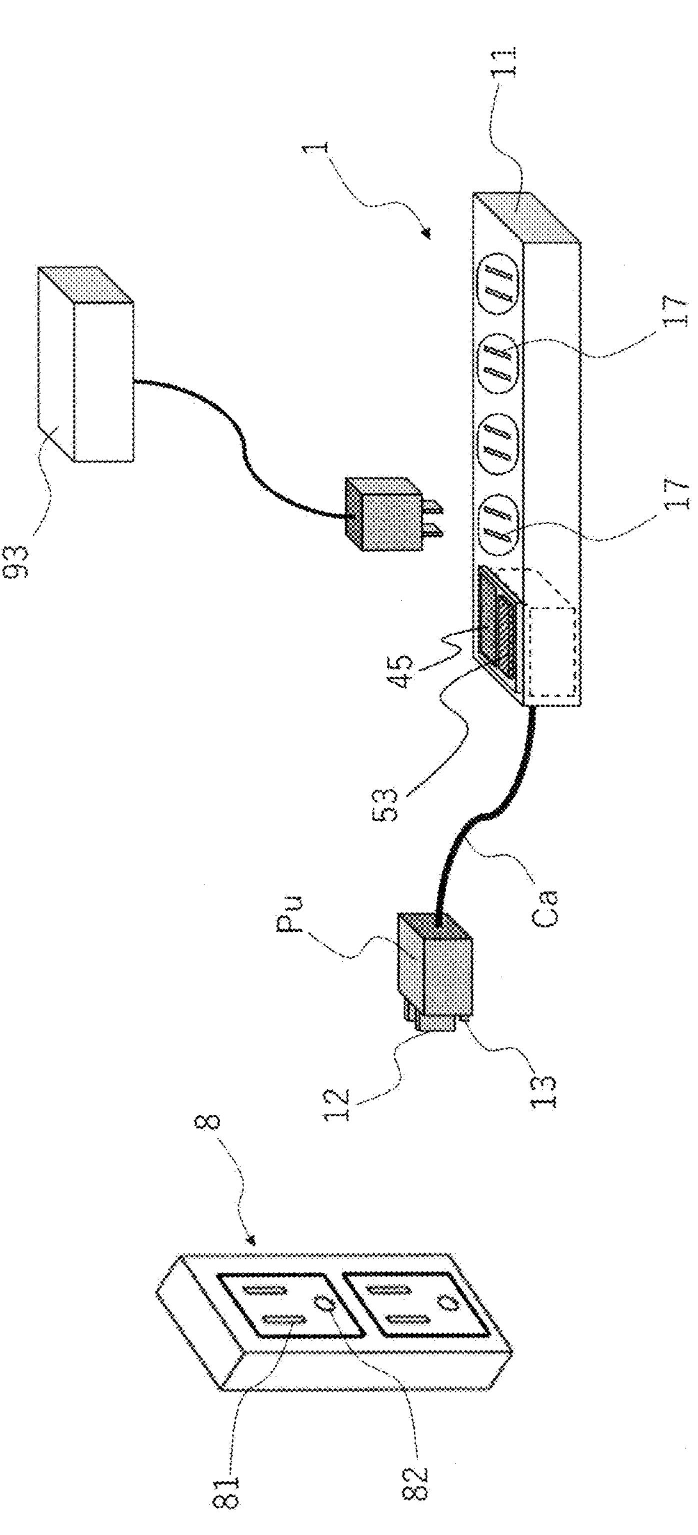
FIG. 18 is a perspective view illustrating a plug-in discharge detection unit, plug sockets, and a load according to a fifth embodiment of the present invention.
Figure 19:
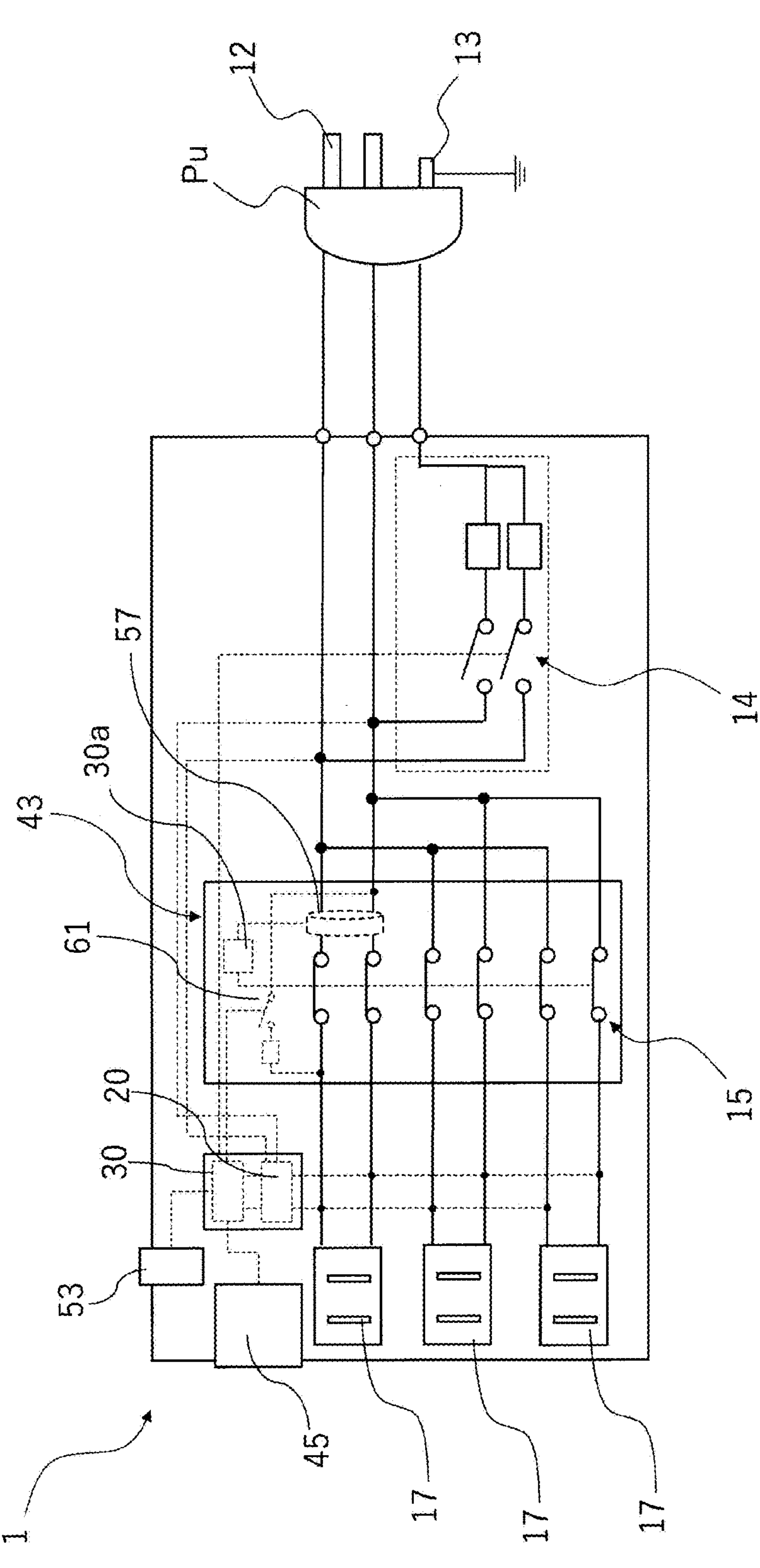
FIG. 19 is a schematic diagram illustrating main circuits configured in a housing of the plug-in discharge detection unit in the fifth embodiment, where the plug-in discharge detection unit is provided with one ZCT and one third switch.

FIGS. 18 and 19 illustrate a plug-in discharge detection unit 1 according to the fifth embodiment of the present invention. As illustrated in FIG. 18, the plug-in discharge detection unit 1 in the present embodiment has a configuration where two plugs 12 and a ground terminal 13 are separated from a housing 11. The two plugs 12 and the ground terminal 13 are stored in a plug case Pu separate from the housing 11. The two plugs 12 and the ground terminal 13 are respectively electrically connected to the circuits of the body of the plug-in discharge detection unit 1 stored in the housing 11 via a power cable Ca. The plug-in discharge detection unit 1 in the present embodiment receives the power supply by inserting the two plugs 12 and the ground terminal 13 stored in the plug case Pu respectively into a plug socket 8. The housing 11 of the plug-in discharge detection unit 1 may be freely arranged within the limits of the length of the power cable Ca. Not covering the plug socket 8, the housing 11 may be larger in size. The housing 11 in the present embodiment is a rectangular parallelepiped extending in one direction and is provided with a plurality of plug sockets 17 side by side.

Each of the plug sockets 17 is provided with two plug insertion holes. Although not shown, female terminals are provided behind the respective two plug insertion holes. The female terminals corresponding to the respective two plug insertion holes are electrically connected to the respective two plugs 12 stored in the plug case Pu via a cutoff section 43 illustrated in FIG. 19. If determination is made that discharge has occurred, the cutoff section 43 cuts off the power supply to all the plug sockets 17.

As illustrated in FIG. 19, the cutoff section 43 is provided with a plurality of second switches 15, a cutoff arithmetic section 30*a*, a ZCT (Zero-phase Current Transformer) 57, and a third switch 61. The primary sides of the second switches 15 are electrically connected to the female terminals provided behind the plug insertion holes of the plug sockets 17. The primary sides of the second switches 15 are electrically connected to either one of the two plugs 12 stored in the plug case Pu via the wirings in the housing 11 and the power cable Ca. That is, the female terminals provided behind the plug insertion holes of all the plug sockets 17 are electrically connected to the respective two plugs 12 stored in the plug case Pu via the second switches 15. In the normal state where discharge does not occur, all the second switches 15 maintain the closed state.

Regarding the plug socket 17 arranged at the top out of the three plug sockets 17 illustrated in FIG. 19, electric wires electrically connected to the primary sides of the respective two second switches 15 corresponding to this plug socket 17 pass through the ZCT 57. The ZCT 57 detects a leakage current based on the difference in the current value between the currents flowing in the two electric wires. A change of the third switch 61 from an open state to a closed state causes the currents flowing in the two electric wires passing through the ZCT 57 to have different current values. The ZCT 57 is electrically connected to the cutoff arithmetic section 30*a*. The cutoff arithmetic section 30*a* is electrically connected to all the second switches 15.

A discharge detection section 20 is provided with a plurality of input channels, not shown. The plurality of input channels of the discharge detection section 20 are electrically connected to the electric wires on the primary sides and the secondary sides of all the second switches 15. If discharge occurs on either the primary side or the secondary side of the cutoff section 43, the noise of the discharge superimposed on the voltage or current is input via any one of the input channels. The discharge detection section 20 thus allows detection of discharge having occurred on either the primary side or the secondary side of the cutoff section 43.

The arithmetic section 30 is electrically connected respectively to two first switches 14 and the third switch 61. The arithmetic section 30 determines whether discharge has occurred based on the detection result of the discharge detection section 20. If determining that discharge has occurred, the arithmetic section 30 determines on which of the primary side or the secondary side of the cutoff section 43 the discharge has occurred. If determining that the discharge has occurred on the secondary side of the cutoff section 43, the arithmetic section 30 changes the third switch 61 from the open state to the closed state. Meanwhile, if determining that the discharge has occurred on the primary side of the cutoff section 43, the arithmetic section 30 changes the two first switches 14 from the open state to the closed state.

In addition, the arithmetic section 30 is capable of determining whether the source of the discharge is on the primary side or the secondary side of the cutoff section 43 based on the input channel through which the noise of the discharge has been input to the discharge detection section 20. Moreover, if the source of the discharge is on the secondary side of the cutoff section 43, the arithmetic section 30 is capable of specifying the one plug socket 17 electrically connected to the load 93 as the source of the discharge based on the input channel through which the noise of the discharge has been input to the discharge detection section 20.

The behavior of the plug-in discharge detection unit 1 illustrated in FIG. 19 is then described. It is assumed that discharge has occurred in the load 93 electrically connected to any one of the three plug sockets 17. The discharge is detected by the discharge detection section 20. The arithmetic section 30 determines that discharge has occurred on the secondary side of the cutoff section 43 based on the detection result of the discharge detection section 20. The arithmetic section 30 changes the third switch 61 from the open state to the closed state. This causes the currents flowing in the two electric wires passing through the ZCT 57 to have different current values. As a result, the ZCT 57 detects a leakage current. The cutoff arithmetic section 30*a* changes all the second switches 15 from the closed state to the open state based on the detection of the leakage current. Thus, the power supply to all the plug sockets 17 is cut off.

Meanwhile, it is assumed that discharge has occurred in the indoor wiring electrically connected to the plug socket 8 illustrated in FIG. 18. The discharge is detected by the discharge detection section 20. The arithmetic section 30 determines that the discharge has occurred on the primary side of the cutoff section 43 based on the detection result of the discharge detection section 20. The arithmetic section 30 changes the two first switches 14 from the open state to the closed state. This causes an artificial leakage current to flow to the ground terminal 13. One of the branch breakers 73 configuring the distribution board 71 detects the artificial leakage current and interrupts the circuit. As a result, the power supply to the indoor wiring electrically connected to the secondary side of the one branch breaker 73 is cut off.

The behavior of the plug-in discharge detection unit 1 illustrated in FIG. 19 is not limited to the above example. For example, the arithmetic section 30 may be configured not to determine on which of the primary side or the secondary side of the cutoff section 43 the discharge has occurred. In this case, if determining that discharge has occurred, the arithmetic section 30 simultaneously changes the two first switches 14 and the third switch 61 from the open state to the closed state. As another example in this case, if determining that discharge has occurred, the arithmetic section 30 changes the two first switches 14 from the open state to the closed state and maintains the open state of the third switch 61.

If discharge occurs in the load 93 electrically connected to any one of the three plug sockets 17 illustrated in FIG. 19, the noise of the discharge sometimes is propagated to the circuit configured on the primary side of the plurality of plug sockets 17. In this case, the noise is input to each of the input channels of the discharge detection section 20 and thus a plurality of discharges turn out to be detected. Accordingly, the arithmetic section 30 is not capable of specifying the one plug socket 17 electrically connected to the load 93 as the source of the discharge based on the input channel to which the noise is input.

In order to prevent propagation of the discharge noise, for example, a filter may be electrically connected on the primary side of each second switch 15. The propagated discharge noises are interrupted by the filter and only the noise of the discharge having occurred in the load 93 is detected by the discharge detection section 20.

For example, if a plurality of discharges are detected, the arithmetic section 30 may specify the one plug socket 17 electrically connected to the load 93 as the source of the discharge based on the noise level of the discharge. The plug socket 17 in which the discharge at the highest noise level is detected has a high possibility of being electrically connected to the load 93 as the source of the discharge.

For example, if a plurality of discharges are detected, the arithmetic section 30 may specify the one plug socket 17 electrically connected to the load 93 as the source of the discharge based on the time of day when the discharge is detected. The plug socket 17 in which the discharge has been detected at the earliest timing has a high possibility of being electrically connected to the load 93 as the source of the discharge.

Figure 20:
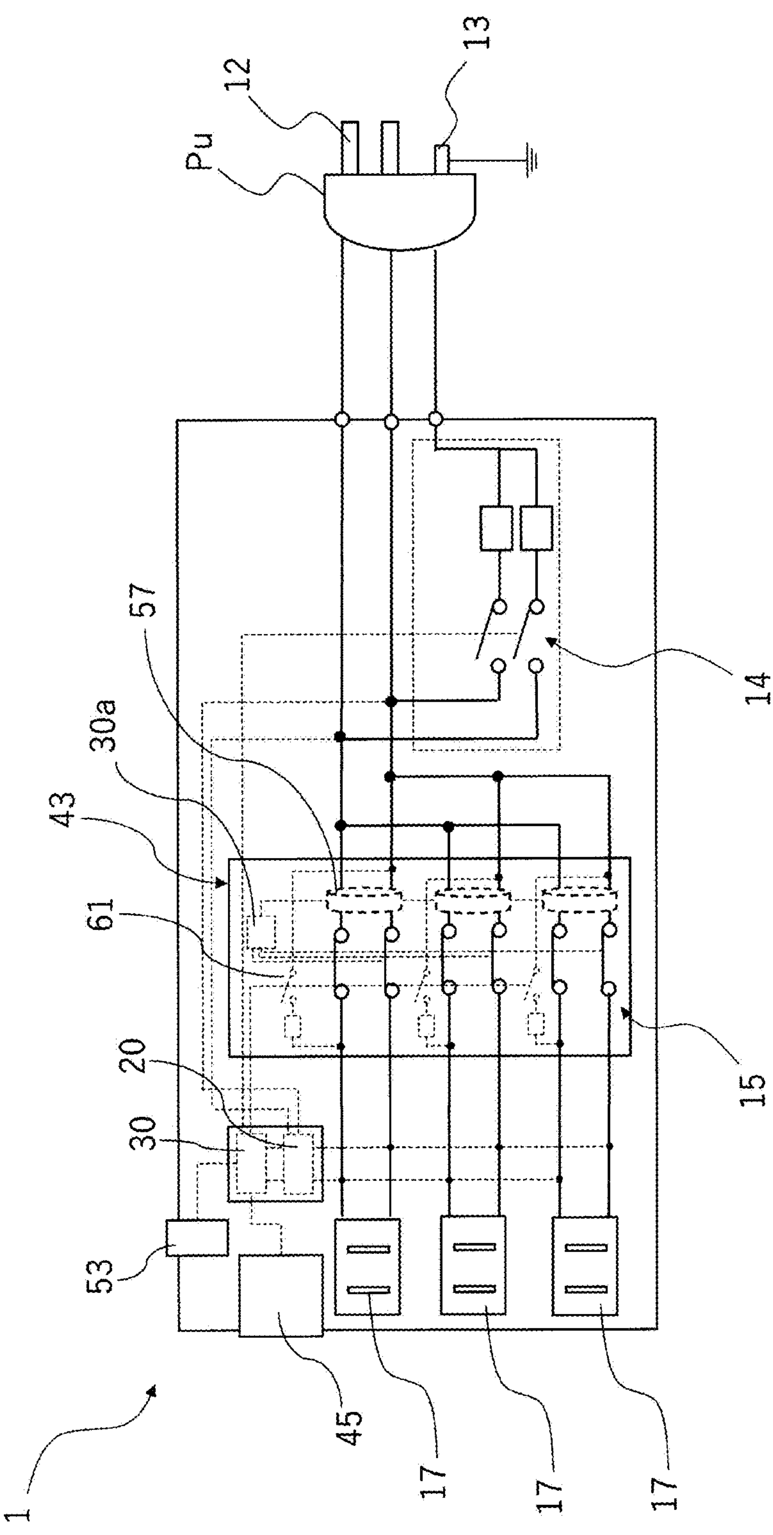
FIG. 20 is a schematic diagram illustrating main circuits configured in a housing of the plug-in discharge detection unit in the fifth embodiment, where the plug-in discharge detection unit is provided with three ZCTs and three third switches.

A plug-in discharge detection unit 1 illustrated in FIG. 20 has a configuration allowing selective cutoff of the power supply to the three plug sockets 17. That is, a cutoff section 43 of the plug-in discharge detection unit 1 illustrated in FIG. 20 is provided with ZCTs 57 and third switches 61 corresponding to the respective three plug sockets 17. The respective three ZCTs 57 are electrically connected to the cutoff arithmetic section 30*a*. The cutoff arithmetic section 30*a* is electrically connected individually to each second switch 15.

If discharge has occurred on the secondary side of the cutoff section 43, the arithmetic section 30 specifies the one plug socket 17 electrically connected to the load 93 as the source of the discharge based on the input channel to which the discharge noise is input. The arithmetic section 30 then changes the third switch 61 corresponding to the one plug socket 17 from the open state to the closed state. Thus, the ZCT 57 corresponding to the one plug socket 17 detects a leakage current. The cutoff arithmetic section 30*a* changes the two second switches 15 corresponding to the one plug socket 17 from the closed state to the open state based on the detected leakage current. As a result, the power supply to the one plug socket 17 is cut off. In this case, the power supply to the other two plug sockets 17 is maintained.

If the discharge detection section 20 detects a plurality of discharges by propagation of a discharge noise, the arithmetic section 30 specifies the one plug socket 17 electrically connected to the load 93 as the source of the discharge based on the noise level of the discharge or the time of day when the discharge is detected. Then, the arithmetic section 30 and the cutoff arithmetic section 30*a* execute the process similar to above, and thus the power supply to the one plug socket 17 is cut off. In this case, the power supply to the other two plug sockets 17 is maintained.

If detecting less dangerous discharge, for example, discharge at a relatively low noise level, the plug-in discharge detection unit 1 illustrated in FIG. 20 may selectively cut off the power supply to the three plug sockets 17. Meanwhile, if detecting highly dangerous discharge, for example, discharge at an extremely high noise level, the plug-in discharge detection unit 1 in the present embodiment may cut off the power supply to all the plug sockets 17. In addition, if detecting highly dangerous discharge, the plug-in discharge detection unit 1 in the present embodiment may changes the two first switches 14 from the open state to the closed state and to interrupt the one branch breaker 73. In such a manner, the plug-in discharge detection unit 1 in the present embodiment is capable of widening stepwise the range of cutting off the power supply in accordance with the dangerousness of the discharge.

It should be noted that, although the plug-in discharge detection unit 1 illustrated in FIG. 20 selectively cuts off the power supply to the three plug sockets 17 by the ZCTs 57 and the third switches 61, the configuration is not limited to this. For example, the arithmetic section 30 specifies the one plug socket 17 electrically connected to the load 93 as the source of the discharge based on the input channel to which the discharge noise is input. The cutoff arithmetic section 30*a* specifies the one plug socket 17 based on the signal input from the arithmetic section 30 and changes the two second switches 15 corresponding to the one plug socket 17 from the closed state to the open state. As a result, the power supply to the one plug socket 17 is cut off.

Figure 21:
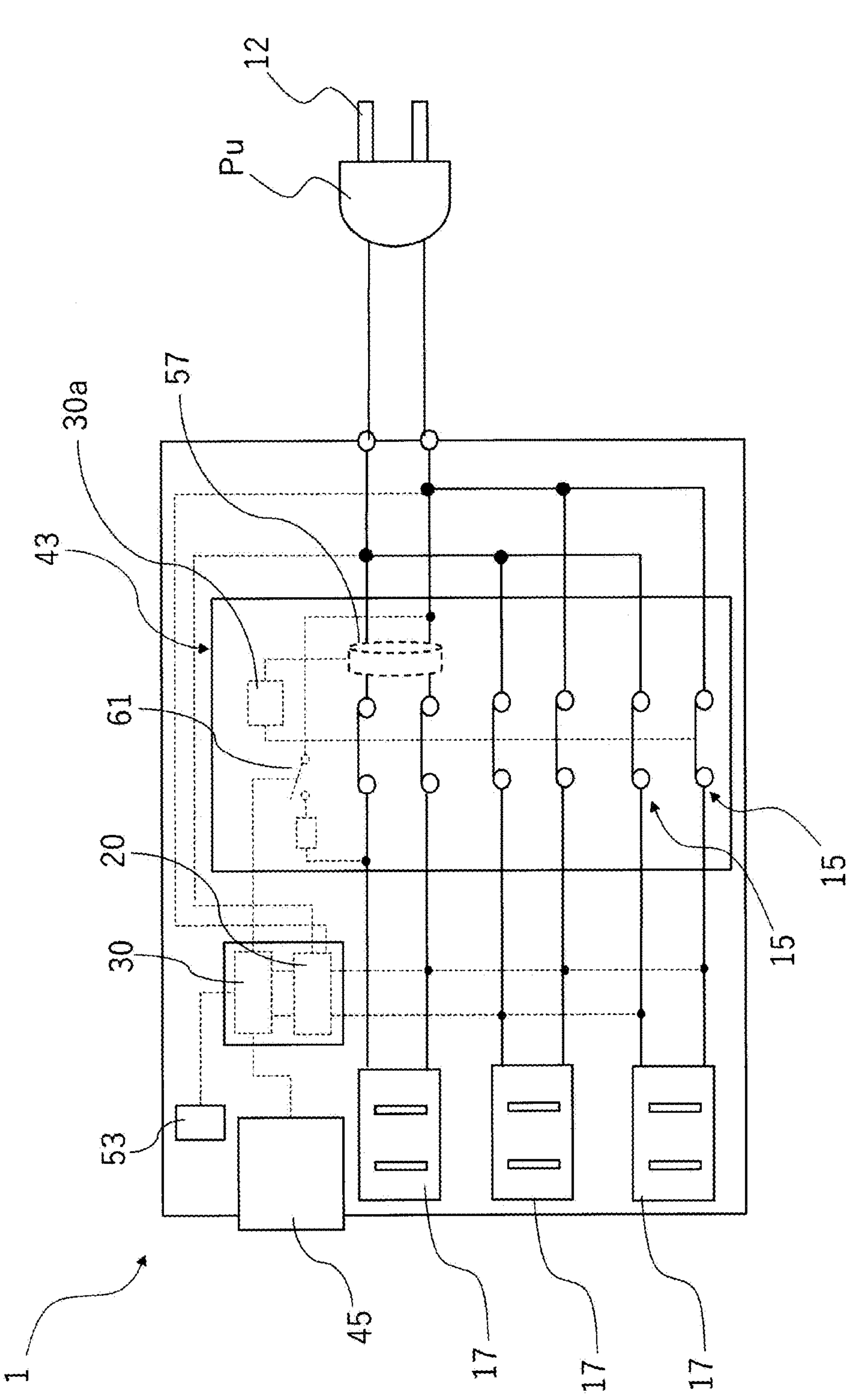
FIG. 21 is a schematic diagram illustrating main circuits configured in a housing of the plug-in discharge detection unit in the fifth embodiment, where the plug-in discharge detection unit is provided with one ZCT and one third switch and is not provided with a configuration to pass an artificial leakage current.

A plug-in discharge detection unit 1 illustrated in FIG. 21 is not provided with a circuit to pass an artificial leakage current through the ground terminal 13, that is, a circuit configured with two first switches 14 and two current limiting resistors 16. If discharge is detected, such a plug-in discharge detection unit 1 is not capable of interrupting one of the branch breakers 73 while it is capable of cutting off the power supply to all the plug sockets 17.

Figure 22:
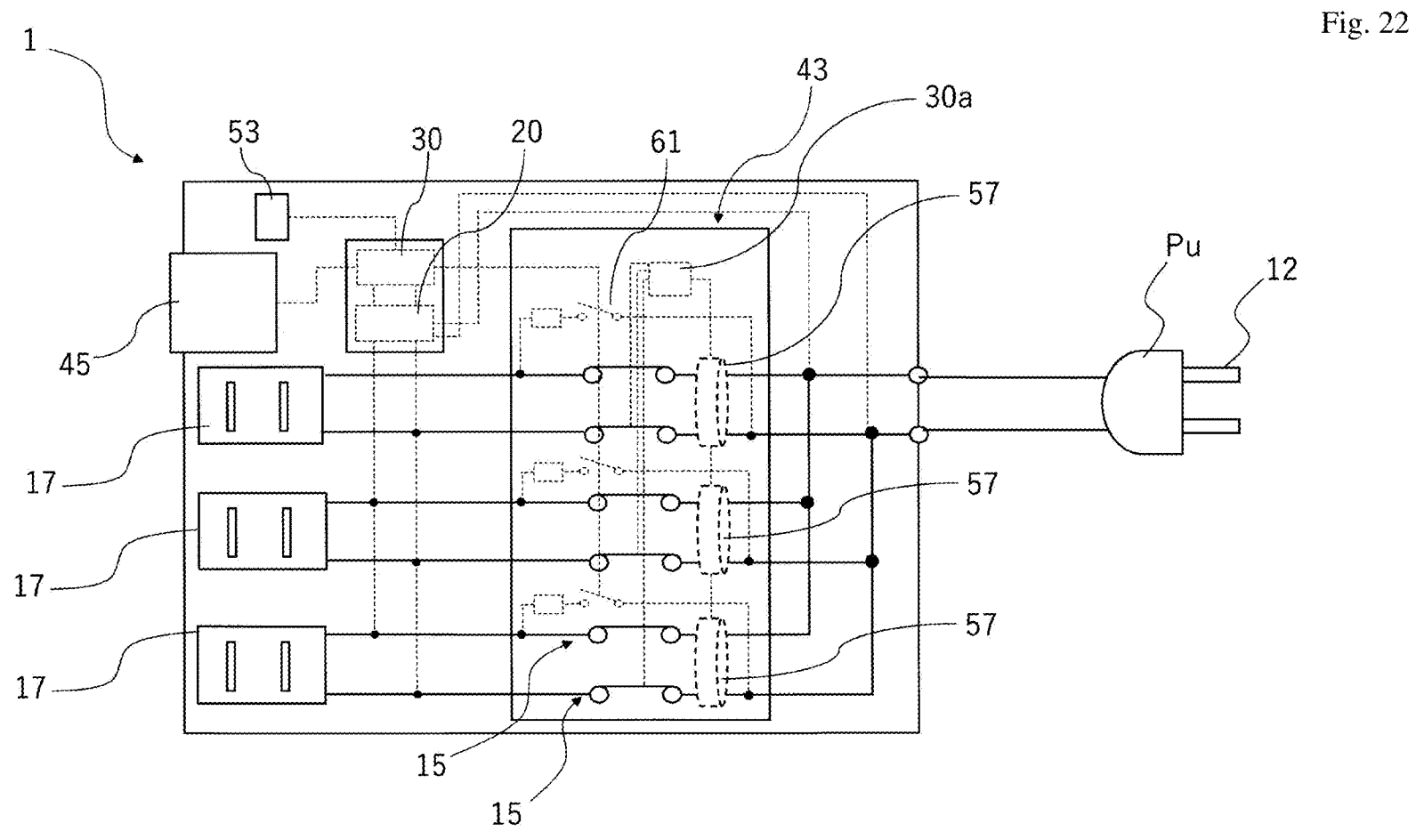

A plug-in discharge detection unit 1 illustrated in FIG. 22 is configured with a cutoff section 43 additionally having ZCTs 57 and third switches 61 corresponding to the respective three plug sockets 17. The configuration other than these is the same as the plug-in discharge detection unit 1 illustrated in FIG. 21. If discharge is detected, the plug-in discharge detection unit 1 illustrated in FIG. 22 is capable of selectively cutting off the power supply to the three plug sockets 17.

It should be noted that, in the plug-in discharge detection unit 1 illustrated in FIG. 21, the cutoff arithmetic section 30*a* may specify one plug socket 17 based on the signal input from the arithmetic section 30 and change the two second switches 15 corresponding to the one plug socket 17 from the closed state to the open state. This allows selective cutoff of the power supply to the three plug sockets 17 with no additional ZCTs 57 and third switches 61.

6. Power Unit

As described in the first embodiment, the plug-in discharge detection unit 1 includes the power supply section 19 to supply power to the circuits in the housing 11 (refer to FIG. 3). A general power circuit essentially requires a transformer to convert the voltage of the utility power. Such a transformer is a large electrical component having a primary coil and a secondary coil wound around an iron core. Accordingly, if the power supply section 19 is configured to include the transformer, the power supply section 19 turns out to be larger in size, causing the housing 11 to be larger as well. Particularly in the case of direct insertion into the plug socket 8 as the plug-in discharge detection unit 1 illustrated in FIG. 5, the housing 11 is desirably smaller in size.

Figure 23:
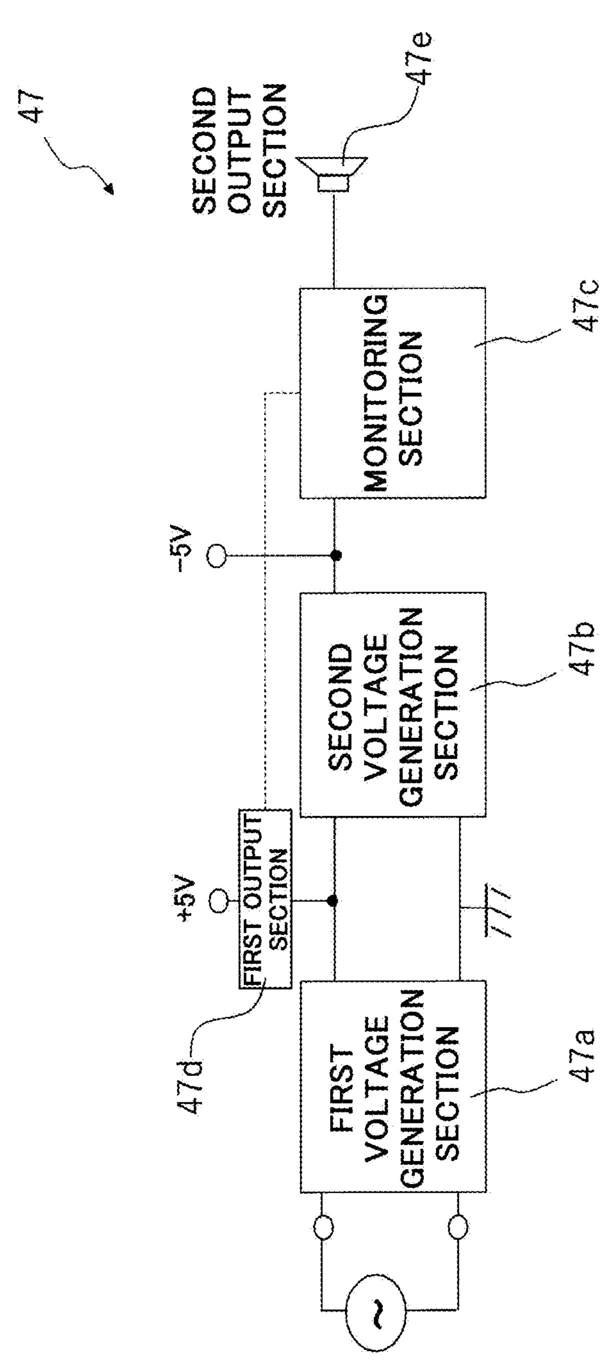
FIG. 23 is a schematic diagram illustrating a main configuration of a power unit suitable for the plug-in discharge detection unit of the present invention.
Figure 24:
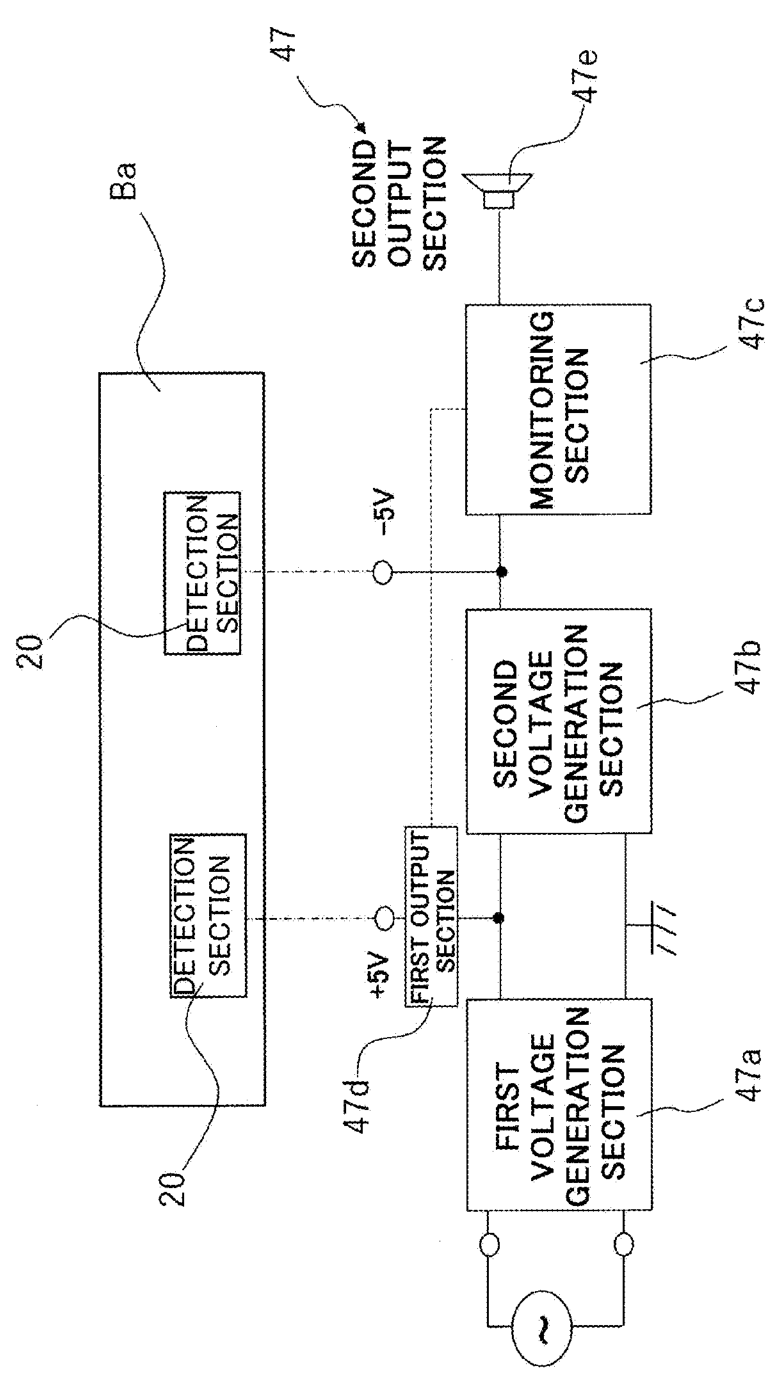
FIG. 24 is a schematic diagram illustrating a state of electrically connecting a power unit to a discharge detection section of the plug-in discharge detection unit.

FIG. 23 illustrates the main configuration of a power unit 47, provided smaller in size and suitable for the plug-in discharge detection unit 1. The power unit 47 converts the utility power supplied from the plug socket 8 to a direct current power supply at a voltage compatible with the plug-in discharge detection unit 1. As illustrated in FIG. 24, the power unit 47 is electrically connected to the discharge detection section 20 implemented on a circuit board Ba of the plug-in discharge detection unit 1. The power unit 47 is mainly configured with a first voltage generation section 47*a*, a second voltage generation section 47*b*, a monitoring section 47*c*, a first output section 47*d*, and a second output section 47*c*.

Figures 25A, 25B, 25C, 25D, 25E:
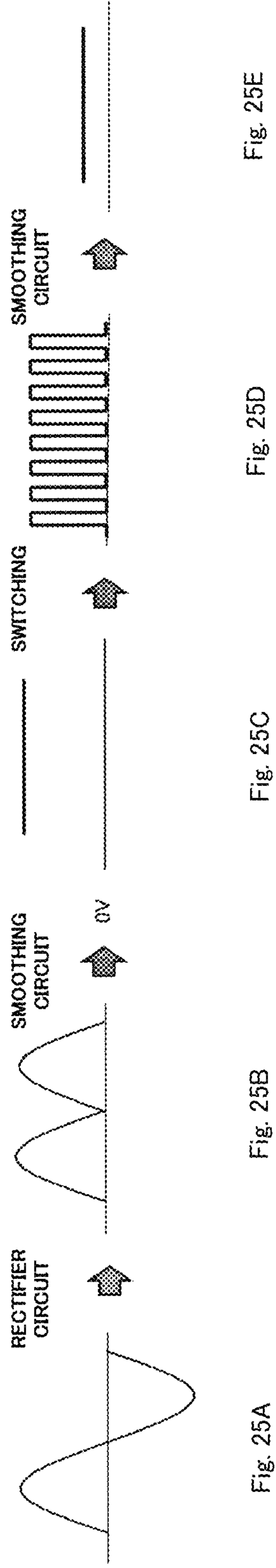
FIGS. 25A through 25E are waveform diagrams illustrating the process of generating a +5 V direct current power supply from a 100 V alternating current power supply by a first voltage generation section of the power unit.

The first voltage generation section 47*a* is configured with a rectifier circuit, a smoothing circuit, and a switching circuit, which are not shown. With reference to FIGS. 25A through 25E, a description is given to the process flow of the respective processes of the rectifier circuit, the smoothing circuit, and the switching circuit. FIG. 25A illustrates the waveform of the utility power supplied from the plug socket 8. The utility power is, for example, a 100 V alternating current power supply and represents a sine wave alternately repeating positive and negative. As illustrated in FIG. 25B, the rectifier circuit inverts the negative current included in the alternating current power supply and rectifies the alternating current power supply to a pulsating flow of the positive current. Since the pulsating flow periodically repeats an increase and decrease in the current, the voltage varies greatly. As illustrated in FIG. 25C, the smoothing circuit smooths the pulsating flow to generate a direct current power supply. The smoothing circuit is configured with, for example, a capacitor and a choke coil. The capacitor conducts charging while the voltage of the pulsating flow is high and conducts discharge while the voltage of the pulsating flow is low. Thus, the increase and decrease in the current of the pulsating flow and the variation of the voltage are suppressed and the waveform is flattened. The choke coil interrupts the components out of the average value in the waveform flattened by the capacitor. Thus, the direct current power supply as illustrated in FIG. 25C is generated. As illustrated in FIG. 25D, the switching circuit repeats turning ON/OFF of the switch at predetermined time intervals to repeatedly generate a pulse wave with a certain width. Narrowing the width of the pulse wave illustrated in FIG. 25D causes the average voltage to be lower, and widening the width of the pulse wave causes the average voltage to be higher. As illustrated in FIG. 25E, the smoothing circuit smooths the repeatedly generated pulse wave to the average value. A+5 V direct current power supply is thus generated. As illustrated in FIG. 24, the +5 V direct current power supply is supplied to the discharge detection section 20 via the first output section 47*d*.

As illustrated in FIG. 23, the second voltage generation section 47*b* is provided with a polarity reversal circuit. The second voltage generation section 47*b* inverts the +5 V direct current power supply generated by the first voltage generation section 47*a* to a −5 V direct current power supply (refer to FIGS. 27A and 27B). As illustrated in FIG. 24, the −5 V direct current power supply is supplied to the discharge detection section 20.

The monitoring section 47*c* monitors the state of the −5 V direct current power supply supplied from the second voltage generation section 47*b*. The monitoring section 47*c* is electrically connected to the first output section 47*d* and the second output section 47*e*. If abnormality occurs in the −5 V direct current power supply supplied from the second voltage generation section 47*b*, the monitoring section 47*c* outputs a signal to the first output section 47*d* and the second output section 47*e*. The second output section 47*e* is a speaker and reports that the abnormality occurs in the −5 V direct current power supply with a sound.

The first output section 47*d* visually reports the state of the +5 V direct current power supply supplied from the first voltage generation section 47*a* and the second voltage generation section 47*b*. As illustrated in FIG. 26, the first output section 47*d* is configured with, for example, a two-color LED. The first output section 47*d* is provided with a green LED device 51*a* and a red LED device 51*b* inside a lens case 45 made of an epoxy resin. The first output section 47*d* is capable of emitting light in three colors of green, red, and orange. The first output section 47*d* is capable of visually reporting four kinds of the state of the +5 V direct current power supply using the lit-up state in three colors and the colorless lit-out state.

As illustrated in FIG. 28A, the noises in a high frequency band generated by discharge are superimposed on each of the positive and negative peaks in the waveform of the 100 V utility power. The 100 V utility power is converted to a +5

V direct current power supply while containing the noises by the power unit 47. As illustrated in FIG. 28B, the noises included in the respective +5 V direct current power supply are extracted by the filter section 21 of the discharge detection section 20 described above. The determination section 31 of the arithmetic section 30 described above determines that discharge has occurred based on the noises.

As illustrated in FIG. 29, the first output section 47*d* visually reports the state of the +5 V direct current power supply using the color of the light emitted by the LED. When the +5 V direct current power supply is normally supplied, the first output section 47*d* causes the LED to emit light in green. If a determination is made that discharge has occurred, the first output section 47*d* causes the LED to emit light in red. If abnormality occurs in the +5 V direct current power supply, the first output section 47*d* causes the LED to be lit out. If abnormality occurs in the −5 V direct current power supply, the first output section 47*d* causes the LED to emit light in orange.

7. Others

The plug-in discharge detection unit and the discharge detection system of the present invention are not limited to the embodiments described above. For example, the plugs 12 and the plug socket 8 are not limited to the kinds illustrated in the drawings and may be any kind, such as A, B, C, SE, B3, BF, O, and O2. Moreover, the plugs 12 and the plug socket 8 may be connectors and ports of the USB (Universal Serial Bus) Type A, B, and C.

DESCRIPTION OF REFERENCE NUMERALS

1 Plug-In Discharge Detection Unit
8 Plug Socket
11 Housing
12 Plug
13 Ground Terminal
14 First Switch
15 Second Switch
16 Current Limiting Resistor
17 Plug Socket
19 Power Supply Section
20 Discharge Detection Section
21 Filter Section
22 Amplification Section
23 Smoothing Section
30 Arithmetic Section
30*a* Cutoff Arithmetic Section
31 Determination Section
32 Output Processing Section
41 Communication Section
43 Cutoff Section
45 Lens Case
47 Power Unit
47*a* First Voltage Generation Section
47*b* Second Voltage Generation Section
47*c* Monitoring Section
47*d* First Output Section
47*e* Second Output Section
51 LED
51*a* Green LED Device
51*b* Red LED Device
52 Speaker
53 Test Button
55 Sensor
57 ZCT
61 Third Switch
71 Distribution Board
72 Main Breaker
73 Branch Breaker
81 Plug Insertion Hole
82 Ground Insertion Hole
91 Computer Terminal
93 Load
100 Discharge Detection System
Pu Plug Case
Ca Power Cable
Ba Circuit Board

The invention claimed is:

1. A plug-in discharge detection unit, comprising two plugs of a cathode and an anode configured to allow insertion into respective two plug insertion holes of a plug socket, a discharge detection section configured to allow detection of a noise of discharge superimposed on a voltage or current, and an arithmetic section configured to allow determination of whether discharge has occurred based on the noise, the detection unit further comprising:

a ground terminal electrically connected to a ground;

at least one first switch electrically connected to a secondary side of the plug;

a current limiting resistor electrically connected to a secondary side of the first switch;

at least one plug socket having at least two plug insertion holes of a cathode and an anode;

at least two female terminals of a cathode and an anode provided behind the respective plug insertion holes and electrically connected to secondary sides of the respective plugs; and at least one second switch electrically connected between the plug and at least one of the female terminals, wherein the current limiting resistor has a secondary side electrically connected to the ground terminal, the arithmetic section changes, if determining that discharge has occurred, the first switch from an open state to a closed state to pass an artificial leakage current with a current value in accordance with a resistance value of the current limiting resistor through the ground terminal, the arithmetic section changes, if determining that discharge has occurred, the second switch from a closed state to an open state to cut off power supply from the plug to the female terminals, and the arithmetic section executes, if determining that discharge has occurred, a process of changing the second switch from the closed state to the open state and later, if again determining that discharge has occurred, executes a process of changing the first switch from the open state to the closed state.

2. The plug-in discharge detection unit according to claim 1, wherein the arithmetic section executes, if determining that discharge has occurred, the process of changing the second switch from the closed state to the open state and, if not determining that discharge has occurred while a predetermined time set in advance passes, maintains the open state of the first switch.

3. The plug-in discharge detection unit, comprising two plugs of a cathode and an anode configured to allow insertion into respective two plug insertion holes of a plug socket, a discharge detection section configured to allow detection of a noise of discharge superimposed on a voltage or current, and an arithmetic section configured to allow determination of whether discharge has occurred based on the noise, the detection unit further comprising:

a ground terminal electrically connected to a ground;

at least one first switch electrically connected to a secondary side of the plug;

a current limiting resistor electrically connected to a secondary side of the first switch;

two or more plug sockets having at least two plug insertion holes of a cathode and an anode;

four or more female terminals of cathodes and anodes provided behind the respective plug insertion holes and electrically connected to secondary sides of the respective plugs; and four or more second switches electrically connected between the respective female terminals and the plugs, wherein the current limiting resistor has a secondary side electrically connected to the ground terminal, the arithmetic section changes, if determining that discharge has occurred, the first switch from an open state to a closed state to pass an artificial leakage current with a current value in accordance with a resistance value of the current limiting resistor through the ground terminal, and the arithmetic section changes, if determining that discharge has occurred, two of the second switches corresponding to at least one of the plug sockets or all the second switches from a closed state to an open state to cut off power supply from the plugs to the two female terminals or all the female terminals.

4. A plug-in discharge detection unit, comprising two plugs of a cathode and an anode configured to allow insertion into respective two plug insertion holes of a plug socket, a discharge detection section configured to allow detection of a noise of discharge superimposed on a voltage or current, and an arithmetic section configured to allow determination of whether discharge has occurred based on the noise, the detection unit further comprising:

a ground terminal electrically connected to a ground;

at least one first switch electrically connected to a secondary side of the plug;

a current limiting resistor electrically connected to a secondary side of the first switch;

at least one plug socket having at least two plug insertion holes of a cathode and an anode;

at least two female terminals of a cathode and an anode provided behind the respective plug insertion holes and electrically connected to secondary sides of the respective plugs; and at least one second switch electrically connected between the plug and at least one of the female terminals, a communication section configured to allow wireless communication with a computer terminal registered in advance, wherein the current limiting resistor has a secondary side electrically connected to the ground terminal, the arithmetic section changes, if determining that discharge has occurred, the first switch from an open state to a closed state to pass an artificial leakage current with a current value in accordance with a resistance value of the current limiting resistor through the ground terminal, the arithmetic section changes, if determining that discharge has occurred, the second switch from a closed state to an open state to cut off power supply from the plug to the female terminals, and the arithmetic section executes, if determining that discharge has occurred, a process of changing the first switch from the open state to the closed state and/or a process of changing the second switch from the closed state to the open state based on an instruction from the computer terminal received by the communication section.

5. The plug-in discharge detection unit according to claim 4, wherein the arithmetic section executes, if not receiving the instruction from the computer terminal while a time determined in advance passes, the process of changing the first switch from the open state to the closed state.

* * * * *